United States Patent
Marauska et al.

(10) Patent No.: US 10,261,138 B2
(45) Date of Patent: Apr. 16, 2019

(54) MAGNETIC FIELD SENSOR WITH MAGNETIC FIELD SHIELD STRUCTURE AND SYSTEMS INCORPORATING SAME

(71) Applicant: NXP B.V., Eindhoven (NL)

(72) Inventors: Stephan Marauska, Kaltenkirchen (DE); Jörg Kock, Horst (DE); Mark Isler, Hamburg (DE); Harmut Matz, Hamburg (DE); Dennis Helmboldt, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/647,709

(22) Filed: Jul. 12, 2017

(65) Prior Publication Data
US 2019/0018080 A1    Jan. 17, 2019

(51) Int. Cl.
*G01R 33/09* (2006.01)
*H01L 43/06* (2006.01)
(Continued)

(52) U.S. Cl.
CPC ......... *G01R 33/09* (2013.01); *G01R 33/0076* (2013.01); *G01R 33/025* (2013.01); *H01L 43/065* (2013.01); *H05K 9/0075* (2013.01)

(58) Field of Classification Search
None
See application file for complete search history.

(56) References Cited

U.S. PATENT DOCUMENTS 5,729,137 A * 3/1998 Daughton ............ G01R 33/09
324/225

5,942,895 A    8/1999 Popovic et al.
(Continued)

FOREIGN PATENT DOCUMENTS

DE    10314602 A1    10/2004
EP    2639594 A2    9/2013
(Continued)

OTHER PUBLICATIONS

Smith, Neil et al; "A high-sensitivity magnetoresistive magnetometer"; Journal of Applied Physics, 69 (8), retreived from the Internet http://aip.scitation.org/doi/abs/10.1063/1.348130; 4 pages (Apr. 15, 1991).

(Continued)

*Primary Examiner* — Clayton E. LaBalle
*Assistant Examiner* — Jas A Sanghera
(74) *Attorney, Agent, or Firm* — Charlene R. Jacobsen

(57) ABSTRACT

A system comprises at least one magnetic field sensor having a magnetic sense element formed on a substrate. The sense element senses a magnetic field along a sense axis oriented in a first direction parallel to a surface of the substrate. A shield structure is formed on the substrate. The shield structure has first and second shield portions and the magnetic sense element is disposed between the shield portions. Each of the shield portions includes a body and first and second brim segments extending from opposing ends of the body. The body is aligned parallel to a second direction perpendicular to the first direction and parallel to the surface of the substrate. The brim segments are aligned substantially parallel to the first direction. The shield portions are arranged in mirror symmetry with the brim segments of each of the shield portions extending toward one another.

19 Claims, 13 Drawing Sheets

(51) Int. Cl.
*H05K 9/00* (2006.01)
*G01R 33/00* (2006.01)
*G01R 33/025* (2006.01)

(56) References Cited

U.S. PATENT DOCUMENTS

| | | | |
|---|---|---|---|
| 6,064,197 | A | 5/2000 | Lochmann et al. |
| 6,545,462 | B2 | 4/2003 | Schott et al. |
| 7,095,228 | B2 | 8/2006 | Steele et al. |
| 7,112,957 | B2 | 9/2006 | Bicking |
| 7,956,604 | B2 | 6/2011 | Ausserlechner |
| 8,125,216 | B2 | 2/2012 | Thomas et al. |
| 8,421,453 | B2 | 4/2013 | Bauer |
| 8,664,945 | B2 | 3/2014 | Laville et al. |
| 9,091,702 | B2 | 7/2015 | Ausserlechner |
| 9,383,227 | B2 | 7/2016 | Sterling |
| 2009/0262466 | A1* | 10/2009 | Kurata .......... B82Y 25/00 360/324 |
| 2013/0265039 | A1 | 10/2013 | Cai et al. |
| 2015/0137796 | A1 | 5/2015 | Ausserlechner |
| 2017/0033278 | A1 | 2/2017 | Lapicki et al. |

FOREIGN PATENT DOCUMENTS

| | | |
|---|---|---|
| EP | 2639594 A3 | 9/2013 |
| JP | 2009-300150 A | 12/2009 |
| JP | 5149964 B2 | 12/2012 |
| JP | 2013-172040 A | 9/2013 |
| JP | 2015-141121 A | 8/2015 |
| WO | WO-98/54547 A1 | 12/1998 |
| WO | WO-2009/151024 A1 | 12/2009 |

OTHER PUBLICATIONS

Popovic, Radivoje S. et al; "Hall ASICs with Integrated Magnetic Concentrators"; retreived from the Internet http://www.gmw.com/magnetic_sensors/sentron/2sa/documents/TN_Hall_IMC_16oct02.pdf ; 12 pages (Oct. 16, 2002).

U.S. Appl. No. 15/703,102; not yet published; 36 pages (filed Sep. 13, 2017).

* cited by examiner

92

92

MAGNETIC FIELD SENSOR WITH MAGNETIC FIELD SHIELD STRUCTURE AND SYSTEMS INCORPORATING SAME

TECHNICAL FIELD OF THE INVENTION

The present invention relates generally to magnetic field sensors. More specifically, the present invention relates to magnetic field sensors with integrated magnetic field shields and systems incorporating the magnetic field sensors for measuring magnetic fields while suppressing stray magnetic fields.

BACKGROUND OF THE INVENTION

Magnetic field sensor systems are utilized in a variety of commercial, industrial, and automotive applications to measure magnetic fields for purposes of speed and direction sensing, rotation angle sensing, proximity sensing, and the like. A stray magnetic field along a non-sensing axis of a magnetic field sensor may change the sensitivity and linearity range of the sensor, thus negatively effecting the magnetic field detection quality.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns magnetic field sensors and magnetic field sensor systems with integrated magnetic field shield structures for measuring magnetic fields while suppressing stray magnetic fields. More particularly, a magnetic field sensor includes one or more magnetic sense elements each of which is encompassed by a magnetic field shield structure. The particular geometric configurations of the shield structure can be varied to provide shielding or suppression of stray magnetic field along a non-sensing axis of the magnetic sense elements with minor or little gain of the measurement magnetic field along a sensing axis of the magnetic sense elements. Further, the geometric parameters of the shield structures can be varied to independently adjust gain along the sensing axis and suppression along the non-sensing axis. The magnetic field shield structures may be vertically integrated with the magnetic sense elements to achieve reductions in size and cost savings. Further, the magnetic field sense elements with the shield structures can be implemented in various system configurations for purposes of speed and direction sensing, rotation angle sensing, proximity sensing, and the like.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
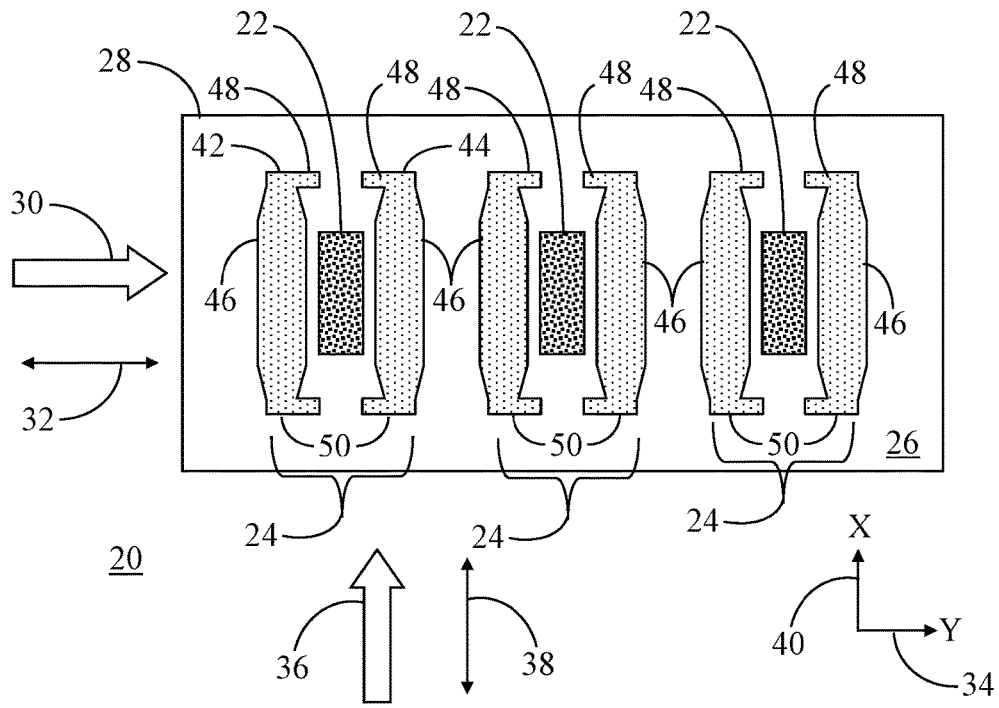
FIG. 1 shows a top view of magnetic field sensor that includes magnetic sense elements each of which is encompassed by a shield structure.

Referring to FIG. 1, FIG. 1 shows a top view of magnetic field sensor 20 that includes magnetic sense elements 22 each of which is encompassed by a shield structure 24. In an embodiment, magnetic sense elements 22 and shield structures 24 are formed on or in a surface 26 of a substrate 28. Magnetic sense elements 22 represent any of a variety of magnetoresistors, such as tunnel magnetoresistance (TMR) sensors, anisotropic magnetoresistance (AMR) sensors, giant magnetoresistance (GMR) sensors, and the like. Further, magnetic sense elements 22 may be a single resistor element as a dot or stripe, or magnetic sense elements 22 may be an array that includes multiple single resistor elements.

In general, magnetic sense elements 22 are configured to sense a measurement magnetic field 30 along a sense axis oriented in a first direction 32 approximately parallel to surface 26 of substrate 28. In this example, the sense axis corresponds to a Y-axis 34 in a three-dimensional coordinate system. As such, Y-axis 34 may alternatively be referred to herein as sense axis 34. Shield structures 24 are configured to suppress a stray magnetic field 36 along a non-sensing axis oriented in a second direction 38 that is perpendicular to first direction 32 and approximately parallel to surface 26 of substrate 28. In this example, the non-sensing axis corresponds to an X-axis 40 in the three-dimensional coordinate system. As such, X-axis 40 may alternatively be referred to herein as non-sensing axis 40.

In this illustration, each shield structure 24 includes a first shield portion 42 and a second shield portion 44, with one of magnetic sense elements 22 disposed between first and second shield portions 42, 44. First and second shield portions 42, 44 may be formed from a high permeability soft magnetic material (e.g., Permalloy) which is deposited on opposing sides of each of magnetic sense elements 22. Each of first and second shield portions 42, 44 includes a body 46 and first and second brim segments 48, 50, respectively, extending from opposing ends of body 46. Body 46 is longitudinally aligned substantially parallel to second direction 38, and is therefore parallel to non-sensing axis 40. First and second brim segments 48, 50 are longitudinally aligned substantially parallel to first direction 32, and are therefore parallel to sense axis 34. First and second shield portions 42, 44 are arranged in mirror symmetry with first and second brim segments 48, 50 of first and second shield portions 42, 44 extending toward one another to approximately surround one of said magnetic sense elements 22. That is, first and second brim segments 48, 50 of first shield portion 42 extend toward first and second brim segments 48, 50 of second shield portion 44 and vice versa.

For simplicity of illustration, only three magnetic sense elements 22 are shown, each of which is disposed between first and second shield portions 42, 44 of each shield structure 24. Alternative embodiments, may include single or multiple magnetoresistive elements arranged in the same plane and laterally spaced apart, and connected in a half or a full Wheatstone bridge configuration to form one or a multitude of magnetic sense elements 22 integrated in or on substrate 28.

Figure 2:
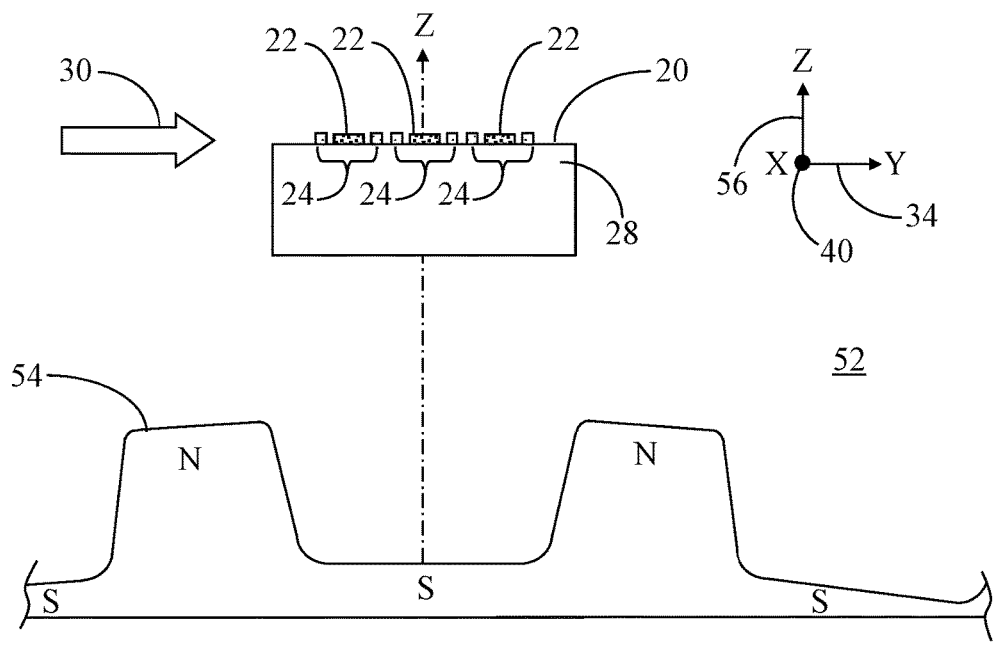
FIG. 2 shows a simplified partial side view of a system for rotational speed measurement.

FIG. 2 shows a simplified partial side view of a system 52 for rotational speed measurement in which magnetic field sensor 20 may be implemented. A magnetic field sensor, such as magnetic field sensor 20, detects changes or disturbances in a magnetic field that has been created or modified, and from this derives information on properties such as direction, presence, (rotational) speed, angle, or electrical currents. In this example, system 52 includes a magnetized encoder wheel 54 for generating a magnetic field, although alternative embodiments may implement a ferromagnetic gear wheel or other similar structure. The presented north (N) and south (S) pole configuration shown in FIG. 2 is one example of an encoder wheel. Other possible magnetizations are possible, such as tooth-to-tooth with alternating north and south poles. Alternatively, the encoder wheel may be unmagnetized as in the case of passive encoders.

In this example configuration, magnetic field sensor 20 is configured to measure rotational speed of encoder wheel 54. Thus, magnetic field sensor 20 is aligned with Y-axis 34 to detect measurement magnetic field 30 generated as the alternating magnetic north and south poles of encoder wheel 54 as they pass by during rotation of encoder wheel 54. Magnetic field sensor 20 converts the pole-sequence into a pulsed output voltage, and the rotational speed of encoder wheel 54 may be derived by counting the pulses per second. A bias magnet (not shown) may be used to adjust the sensitivity and measurement range of magnetic field sensor 20 as will be discussed in greater detail below.

FIG. 2 does not show magnetic field sensor 20 in a packaged form and attached to a corresponding structure for simplicity of illustration. Rather, magnetic field sensor 20 is shown displaced away from encoder wheel 54 relative to a Z-axis 56 of the three-dimensional coordinate system. In an actual configuration, it should be readily apparent that magnetic field sensor 20 will be packaged and attached to a support structure in suitable proximity to encoder wheel 54.

The particular geometric configurations of the shield structure (e.g., shield structure 24) discussed below in connection with FIGS. 3-6 can be varied to provide shielding or suppression of stray magnetic field 36 (FIG. 1) along non-sensing axis 40 of magnetic sense element 22 with minor or little gain of measurement magnetic field 30 along sense axis 34 of magnetic sense element 22.

Figure 3:
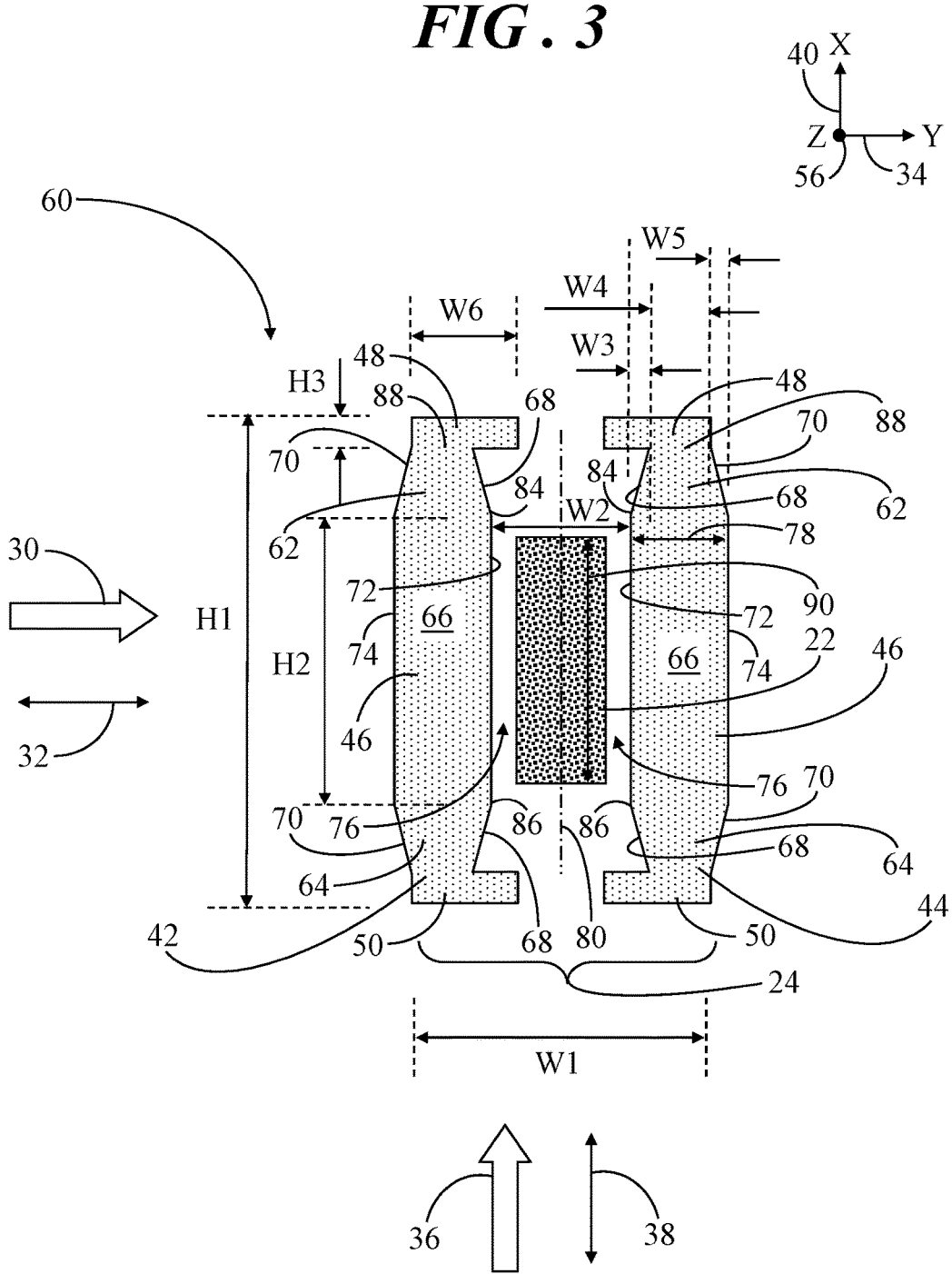
FIG. 3 shows a top view of a magnetic sense element and a shield structure demonstrating a geometric configuration of the shield structure in accordance with an embodiment.

Referring now to FIG. 3, FIG. 3 shows a top view of magnetic sense element 22 and shield structure 24 demonstrating a first geometric configuration 60 of shield structure 24 in accordance with an embodiment. Body 46 of each of first and second shield portions 42, 44 includes a first end section 62 coupled to first brim segment 48, a second end section 64 coupled to second brim segment 50, and an intermediate section 66 interposed between first and second end sections 62, 64. Each of first and second end sections 62, 64 has a first sidewall 68 and a second sidewall 70. Similarly, intermediate section 66 has a first section sidewall 72 and a second section sidewall 74. First section sidewall 72 of intermediate section 66 is coupled to and contiguous with first sidewall 68 of each of first and second end sections 62, 64, and second section sidewall 74 is coupled to and contiguous with second sidewall 70 of each of first and second end sections 62, 64. Shield structure 24, including first and second sidewalls 68, 70 and first and second section sidewalls 72, 74 extend parallel to Z-axis 56, and therefore into the page upon which FIG. 3 is drawn.

First section sidewall 72 of body 46 of each of first and second shield portions 42, 44 is laterally spaced apart from magnetic sense element 22 by a gap 76. Additionally, second section sidewall 74 is separated from first section sidewall 72 by a width 78 of intermediate section 66 in first direction 32. First section sidewall 72 of intermediate section 66 is laterally displaced in first direction 32 away from a centerline 80 of magnetic sense element 22 by a first distance, which is one half of W2. In this example, first sidewall 68 of each of first and second end sections 62, 64 tapers away from centerline 80 from a first distance (which is one half of W2) at a junction 84 of first section sidewall 72 and first sidewall 68 to a second distance (which is one half of W2 summed with W3) at a junction 88 of first sidewall 68 and a corresponding one of first and second brim segments 48, 50 such that the second distance is greater than the first distance. Additionally, second sidewall 70 of each of first and second end sections 62, 64 tapers away from second section sidewall 74 toward first sidewall 68. Thus, in the illustrated first geometric configuration, first and second sidewalls 68, 70 of each of first and second end sections 62, 64 taper toward one another to suitably direct stray magnetic field 38 through intermediate section 66 toward first and second brim segments 48, 50.

In the example shown in FIG. 3, first geometric configuration 60 of shield structure 24 can be characterized by a width, W1, parallel to first direction 32, that is a summation of widths, W2, W3, and W4. The width, W2, denotes a separation between first section sidewalls 72 of first and second shield portions 42, 44. The width, W3, denotes a material portion of intermediate section 66 of each first and second shield portions 42, 44 between first section sidewall 72 and the interconnection of first sidewall 68 of first and second end sections 62, 64 with first and second brim segments 48, 50. The width, W4, denotes a constant width of first and second end sections 62, 64 and intermediate section 66. The width, W5, denotes a material portion of intermediate section 66 of each first and second shield portions 42, 44 between second section sidewall 74 and the interconnection of second sidewall 70 of first and second end sections 62, 64 with first and second brim segments 48, 50. Thus, in first geometric configuration 60, width 78 of intermediate section 66 is equivalent to W3+W4+W5, the first distance is one half of W2, and the second distance is one half of W2 summed with W3.

The dimension, H1, is the total length of first and second shield portions 42, 44 parallel to second direction 38. The dimension, H2, is the length of intermediate section 66 in second direction 38, and the dimension, H3, is the width of first and second brim segments 48, 50 in second direction 38. In an embodiment, H2 oriented in second direction 38 is no less than a length 90 of magnetic sense element 22 in second direction 38. However, in alternative embodiments, H2 may be less than or equal to length 90.

Some prior art systems may be subject to saturation effects in the presence of very high measurement magnetic fields 30. For example, a speed sensing application may be subject to measurement magnetic field 30 of approximately 60 kA/m, where kA/m denotes kiloamperes per meter. Saturation of a shield structure could lead to a change in μr from much greater than one (as in some prior art systems) to a value of one (i.e., vacuum permeability). That is, when magnetic measurement field 30 increases to high values (over the saturation limit), the gain will decrease. The combined effect could be a decrease in magnetic measurement field 30 detected by magnetic sense element 22, resulting in an incorrect measurement.

Accordingly, it may be desirable for magnetic sense element 22 to be robust against saturation effects in the presence of very high measurement magnetic fields 30. By way of example, it may be preferred to incur minor to no gain of measurement magnetic field 30. This may be accomplished by the lean design of the width (e.g., W3+W4+W5) of intermediate section 66 in the region of H2. Thus, the various widths (W1, W2, W3, W4, W5) can influence the gain of measurement magnetic field 30 in first direction 32 along sense axis 34.

Conversely, first and second brim segments 48, 50 defined by H3 and W6 allows for tuning of the suppression effect in order to effectively suppress stray magnetic field 36 in second direction 38 along non-sensing axis 40. In particular, the length of first and second brim segments 48, 50 denoted by W6 determines a magnitude of suppression of stray magnetic field 36. As such, a greater length, W6, of first and second brim segments 48, 50 in first direction 32 yields greater suppression and a shorter length, W6, of first and second brim segments 48, 50 yields lower suppression of stray magnetic field 36.

Under some conditions, it may be desirable to utilize a bias magnet (discussed below) to stabilize magnetic sense element 22 (i.e., prevent flipping, adjust sensitivity, and adjust range) to effectively establish suitable working conditions for magnetic field sensor 20 (FIG. 1). A bias magnetic field from a bias magnet can be affected by the magnitude of suppression of stray magnetic field 36. In particular, greater suppression of stray magnetic field 36 requires a stronger bias magnetic field. However, a maximum generatable bias magnetic field of the bias magnet is limited by physical (material) and technological (design) constraints. Thus, the shielding value may be kept relatively low to enable the use of a bias magnet. In some embodiments, a target value for suppression or shielding of stray magnetic field 36 is in a range of two to twenty times to enable inclusion of a bias magnet for stabilizing magnetic field sensor.

Therefore, the variability of the various geometric parameters described above enables the independent adjustment of gain in first direction 32 along sense axis 34 and suppression in second direction 38 along non-sensing axis 40.

Figure 4:
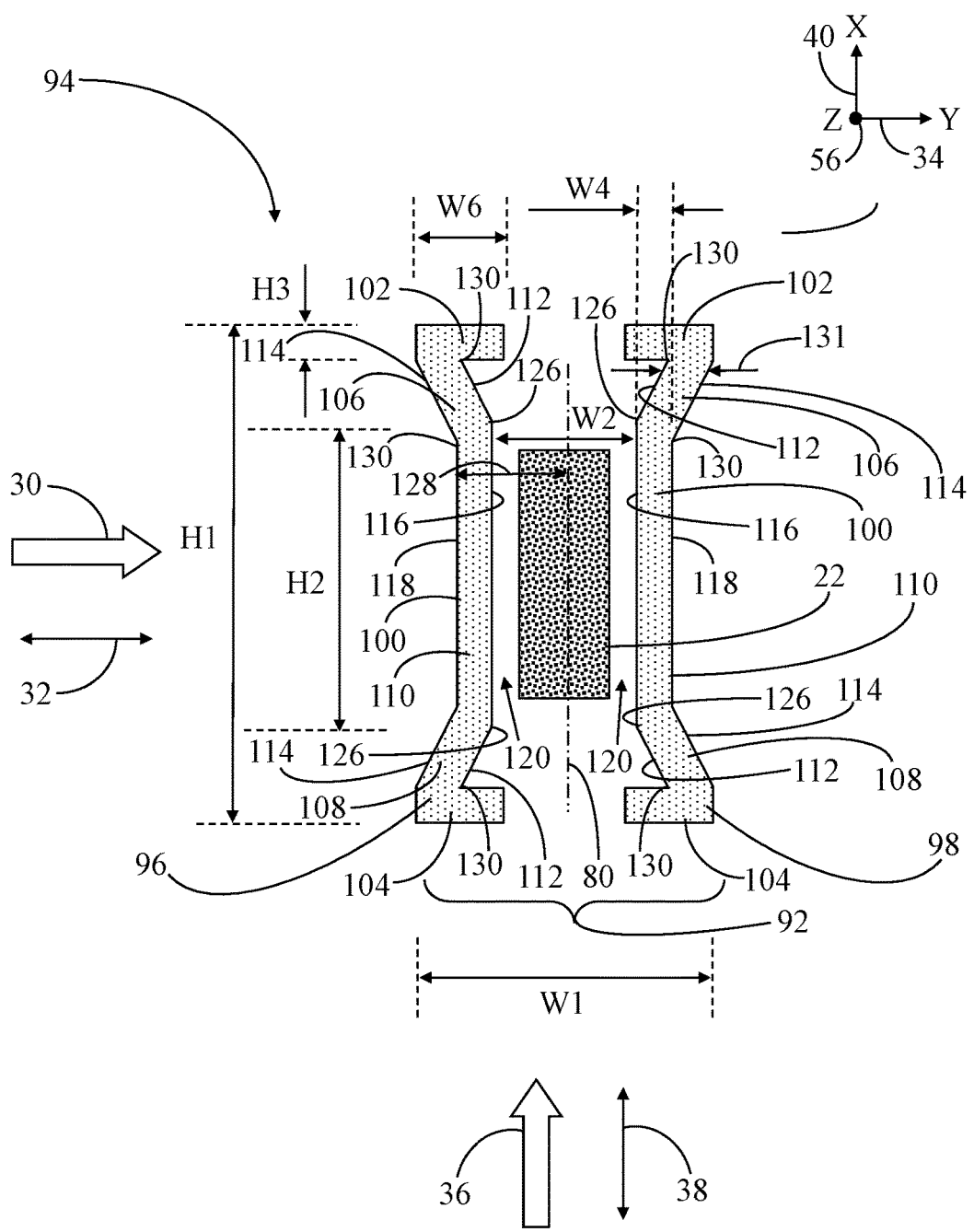
FIG. 4 shows a top view of a magnetic sense element and a shield structure demonstrating a geometric configuration of the shield structure in accordance with another embodiment.

FIG. 4 shows a top view of magnetic sense element 22 and a shield structure 92 demonstrating a second geometric configuration 94 in accordance with another embodiment. In this example, shield structure 92 includes a first shield portion 96 and a second shield portion 98, with one of magnetic sense elements 22 disposed between first and second shield portions 96, 98. Each of first and second shield portions 96, 98 includes a body 100 and first and second brim segments 102, 104, respectively, extending from opposing ends of body 100. Body 100 is longitudinally aligned substantially parallel to second direction 38, and is therefore parallel to sense non-sensing axis 40. First and second brim segments 102, 104 are longitudinally aligned substantially parallel to first direction 32, and are therefore parallel to sense axis 34. First and second shield portions 96, 98 are arranged in mirror symmetry with first and second brim segments 102, 104 of each of first and second shield portions 96, 98 extending toward one another. That is, first and second brim segments 102, 104 of first shield portion 96 extend toward first and second brim segments 102, 104 of second shield portion 104 and vice versa.

Body 100 of each of first and second shield portions 96, 98 includes a first end section 106 coupled to first brim segment 102, a second end section 108 coupled to second brim segment 104, and an intermediate section 110 interposed between first and second end sections 106, 108. Each of first and second sections 106, 108 has a first sidewall 112 and a second sidewall 114. Similarly, intermediate section 110 has a first section sidewall 116 and a second section sidewall 118. First section sidewall 116 of intermediate section 110 is coupled to and contiguous with first sidewall 112 of each of first and second end sections 106, 108, and second section sidewall 118 is coupled to and contiguous with second sidewall 114 of each of first and second end sections 106, 108. Shield structure 92 including first and second sidewalls 112, 114 and first and second section sidewalls 116, 118 extend parallel to Z-axis 56, and therefore into the page upon which FIG. 3 is drawn. First section sidewall 116 of body 100 of each of first and second shield portions 96, 98 is laterally spaced apart from magnetic sense element 22 by a gap 120. Additionally, second section sidewall 118 is separated from first section sidewall 116 by a width, labeled W4, of intermediate section 110 in first direction 32. First section sidewall 116 of intermediate section 110 is laterally displaced in first direction 32 away from centerline 80 of magnetic sense element 22 by a first distance (i.e., one half of W2).

In second geometric configuration 94 of FIG. 4, first sidewall 112 of each of first and second end sections 106, 108 tapers away from centerline 80 from the first distance (i.e., one half of W2) at a junction 126 of first section sidewall 116 and first sidewall 112 to a second distance (i.e., one half of W2 summed with W4) at a junction 130 of first sidewall 112 and a corresponding one of first and second brim segments 102, 104 such that the second distance is greater than the first distance. Additionally, second sidewall 114 of each of first and second end sections 106, 108 tapers away from second section sidewall 118, but is oriented substantially parallel to first sidewall 112 of first and second end sections 106, 108. Further, a width 131 of each of first and second end sections 106, 108 in first direction 32 is substantially equivalent to the width, labeled W4, of intermediate section 110 in first direction 32.

Figure 5:
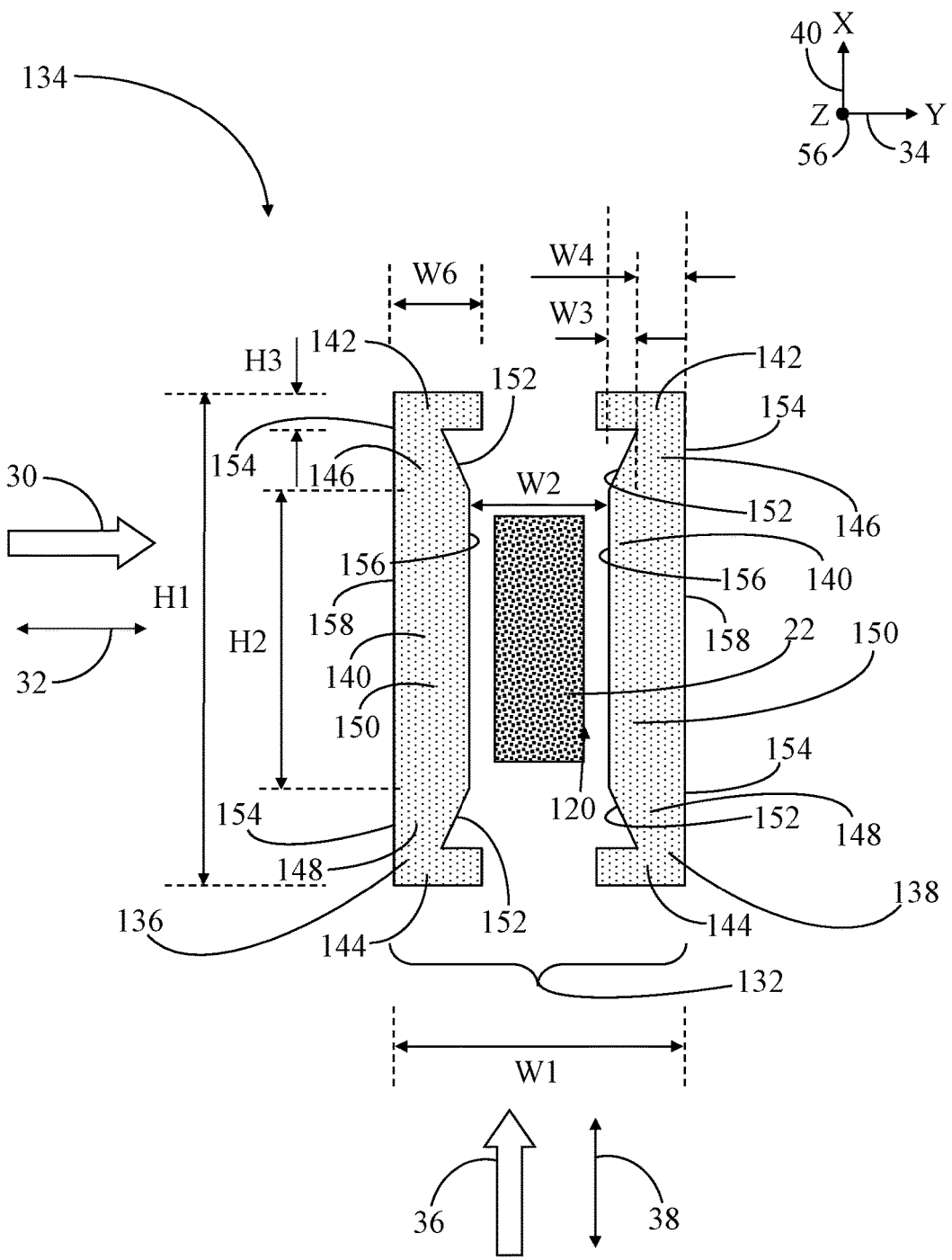
FIG. 5 shows a top view of a magnetic sense element and a shield structure demonstrating a geometric configuration of the shield structure in accordance with another embodiment.

FIG. 5 shows a top view of magnetic sense element 22 and a shield structure 132 demonstrating a third geometric configuration 134 of shield structure 132 in accordance with another embodiment. In this example, shield structure 132 includes a first shield portion 136 and a second shield portion 138, with one of magnetic sense elements 22 disposed between first and second shield portions 136, 138. Each of first and second shield portions 136, 138 includes a body 140 and first and second brim segments 142, 144, respectively, extending from opposing ends of body 140. Body 140 is longitudinally aligned substantially parallel to second direction 38, and is therefore parallel to sense non-sensing axis 40. First and second brim segments 142, 144 are longitudinally aligned substantially parallel to first direction 32, and are therefore parallel to sense axis 34. First and second shield portions 136, 138 are arranged in mirror symmetry with first and second brim segments 142, 144 of each of the first and second shield portions 136, 138 extending toward one another. That is, first and second brim segments 142, 144 of first shield portion 136 extend toward first and second brim segments 142, 144 of second shield portion 138 and vice versa.

Body 140 of each of first and second shield portions 136, 138 includes a first end section 146 coupled to first brim segment 142, a second end section 148 coupled to second brim segment 144, and an intermediate section 150 interposed between first and second end sections 146, 148. Each of first and second sections 146, 148 has a first sidewall 152 and a second sidewall 154. Similarly, intermediate section 150 has a first section sidewall 156 and a second section sidewall 158. First sidewall 152 of each of first and second end sections 146, 148 is coupled to and contiguous with first section sidewall 156. Second sidewall 154 of each of first and second end sections 146, 148 is coupled to and contiguous with second section sidewall 158. Third geometric configuration 134 of shield structure 132 is similar to first geometric configuration 60 (FIG. 1), with the exception being that second sidewall 154 of first and second end sections 146, 148 is longitudinally aligned with second section sidewall 158 in second direction 38.

Figure 6:
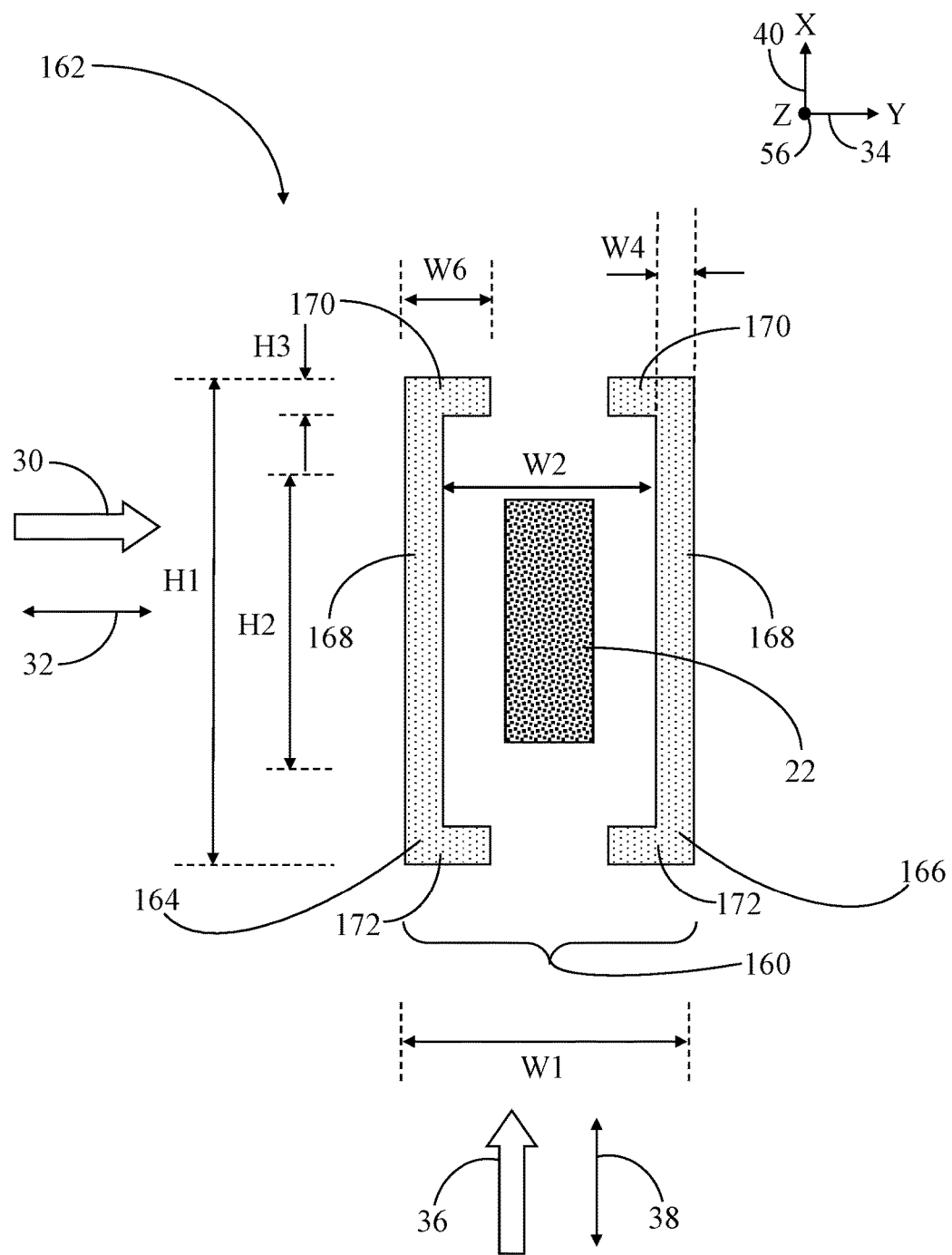
FIG. 6 shows a top view of a magnetic sense element and a shield structure demonstrating a baseline geometric configuration of the shield structure.

FIG. 6 shows a top view of magnetic sense element 22 and shield structure 160 demonstrating a baseline geometric configuration 162 of shield structure 160. Like the shield structures 24 (FIG. 3), 92 (FIG. 4), and 132 (FIG. 5), shield structure 160 includes a first shield portion 164 and a second shield portion 166, with one of magnetic sense elements 22 disposed between first and second shield portions 164, 166. Each of first and second shield portions 164, 166 includes a body 168 and first and second brim segments 170, 172, respectively, extending from opposing ends of body 168. Body 168 is longitudinally aligned substantially parallel to second direction 38, and is therefore parallel to non-sensing axis 40. First and second brim segments 170, 172 are longitudinally aligned substantially parallel to first direction 32, and are therefore parallel to sense axis 34. First and second shield portions 164, 166 are arranged in mirror symmetry with first and second brim segments 170, 172 of each of the first and second shield portions 164, 166 extending toward one another. That is, first and second brim segments 170, 172 of first shield portion 164 extend toward first and second brim segments 170, 172 of second shield portion 166 and vice versa.

Referring collectively to FIGS. 3-6, the various dimensions H1, H2, H3, W1, W2, W3, W4, W5, W6 influence the gain of measurement magnetic field 30 in first direction 32 along sense axis 34 and influence suppression of stray magnetic field 36 in second direction 38 along non-sensing axis 40. In the above presented example, the geometric configuration of each of shield structures 24, 92, 132, 160 may enhance the magnetic field uniformity for the distribution of measurement magnetic field 30 along sense axis 34, with second and third geometric configurations 94 (FIG. 4), 134 (FIG. 5) ranking the best. Additionally, each of shield structures 24, 92, 132, 160 may enhance the magnetic field uniformity for distribution of stray magnetic field 36 along non-sensing axis 40, with second and third geometric configurations 94, 134 again ranking the best. In general, a larger value of W2 may yield lower suppression and lower gain. Larger values of W3, W4, W5 may yield higher gain and higher saturation fields (advantageous for high measurement magnetic fields). Larger values of H2, H3, W6 may yield higher suppression.

First geometric configuration 60 of shield structure 24 may result in the highest gain, baseline geometric configuration 162 may result in the lowest gain, and the gain for second and third geometric configurations 92, 132 may fall between the highest and lowest gains achieved. Nevertheless, the gain may range from approximately 1.1 for first geometric configuration 60 to 1.0 for baseline geometric configuration 162. In all configurations, suppression of stray magnetic field 36 may be similar. Accordingly, second and third geometric configurations 94, 134 of shield structures 92, 132 may yield the best magnetic field uniformity as well as a sufficiently low gain to largely mitigate the problem of saturation effects in the presence of very high measurement magnetic fields.

Figure 7:
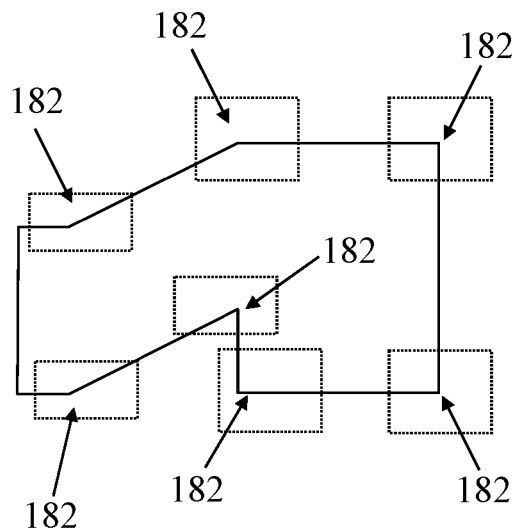
FIG. 7 shows an enlarged partial top view of a shield structure demonstrating a configuration having sharp edges.
Figure 8:
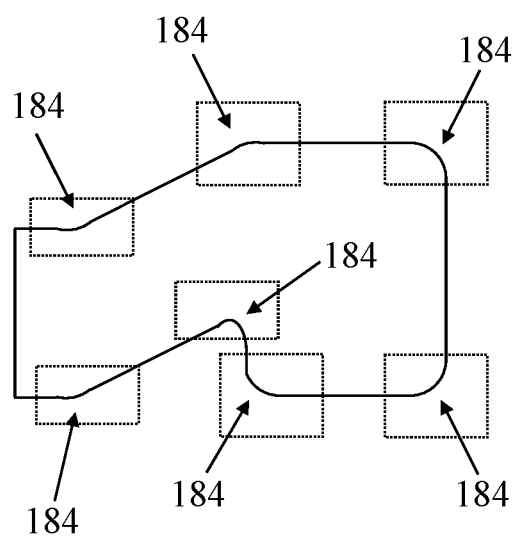
FIG. 8 shows an enlarged partial top view of a shield structure demonstrating a configuration having rounded edges.

Referring now to FIGS. 7-8, FIG. 7 shows an enlarged partial top view of shield structure 92 demonstrating a configuration having sharp edges 182 and FIG. 8 shows an enlarged partial top view of shield structure 92 demonstrating a configuration having rounded edges 184. Rounded edges 184 may be provided at each transition between different sections of shield structure to yield a relatively smooth shape. Any of the above described shield structures 24, 92, 132, 160 may have sharp edges 182 or rounded edges 184. Sharp edges 182 may lead to significant magnetic field changes (e.g., magnetic field peaks/dips) at these sharp edges 182, thus resulting in inhomogeneity. Conversely, rounded edges 184 may reduce magnetic field changes relative to sharp edges 182 thereby resulting in improved homogeneity.

Figure 9:
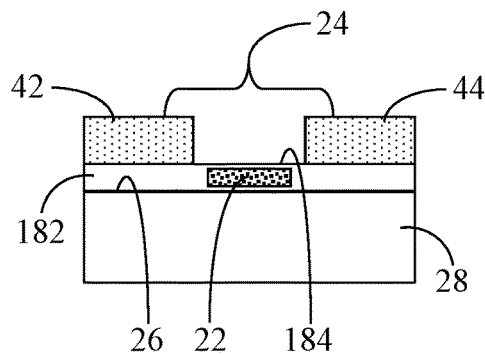
FIG. 9 shows a partial side view of a magnetic sense element and shield structure integrated on a substrate.

FIG. 9 shows a partial side view of magnetic sense element 22 and shield structure 24 integrated on substrate 28 in accordance with an embodiment. As shown, magnetic sense element 22 is embedded within a protective material layer 182 (e.g., passivation coating, silicon nitride, wafer coat, and the like) on surface 26 of substrate 28. First and second portions 42, 44 of shield structure 24 are formed at an outer surface 184 of protective layer 182.

Figure 10:
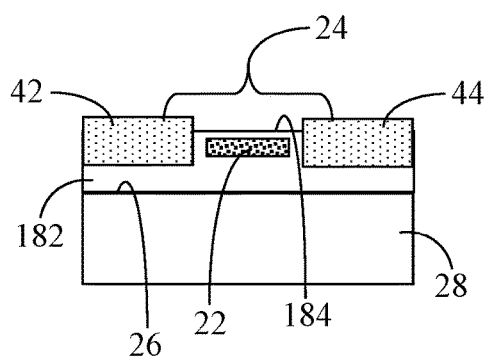
FIG. 10 shows a partial side view of a magnetic sense element and shield structure integrated on a substrate in accordance with another embodiment.

FIG. 10 shows a partial side view of a magnetic sense element 22 and shield structure 24 integrated on substrate 28 in accordance with another embodiment. As shown, magnetic sense element 22 is embedded within protective material layer 182 on surface 26 of substrate 28. However, in this example, at least a portion of first and second portions 42, 44 of shield structure 24 are also embedded within and located below outer surface 184 of protective layer 182.

Figure 11:
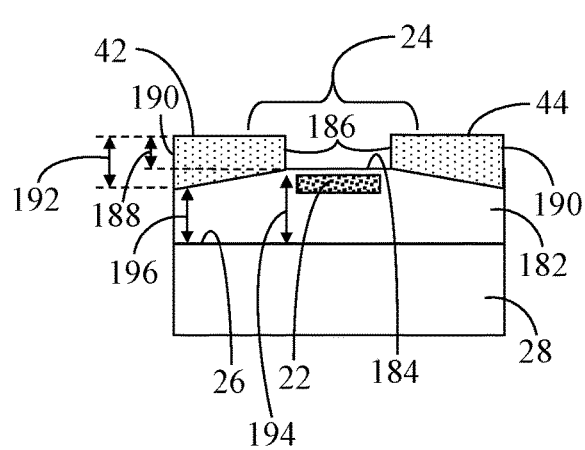
FIG. 11 shows a partial side view of a magnetic sense element and shield structure integrated on a substrate in accordance with another embodiment.

FIG. 11 shows a partial side view of magnetic sense element 22 and shield structure 24 integrated on substrate 28 in accordance with another embodiment. Like the configuration of FIG. 9, magnetic sense element 22 is embedded within protective material layer 182 on surface 26 of substrate 28, and first and second portions 42, 44 of shield structure 24 are generally formed at outer surface 184 of protective layer 182. However, in this example, each of first and second portions 42, 44 of shield structure 24 has a tapered profile such that a first sidewall 186 closest to magnetic sense element 22 has a first thickness 188 and a second sidewall 190 farthest from magnetic sense element 22 has a second thickness 192 that is greater than first thickness 188. Accordingly, first sidewall 186 is spaced apart from surface 26 of substrate 28 by a first distance 194 and second sidewall 188 is spaced apart from surface 26 of substrate by a second distance 196, with second distance 196 being less than first distance 194.

Figure 12:
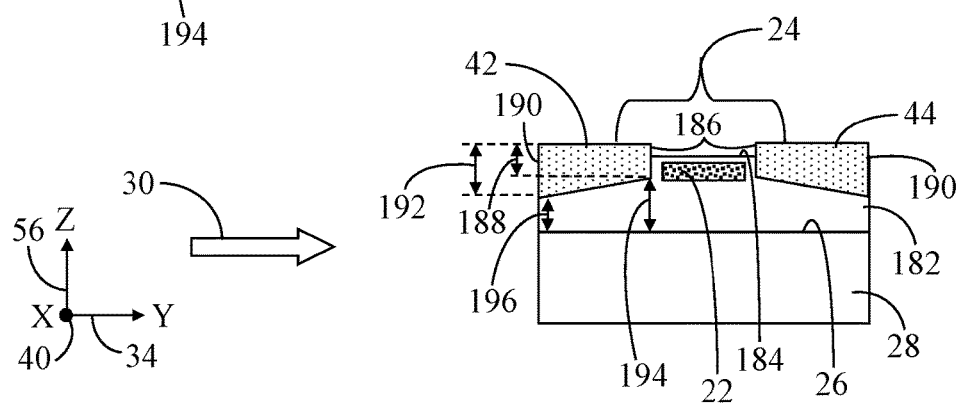
FIG. 12 shows a partial side view of a magnetic sense element and shield structure integrated on a substrate in accordance with another embodiment.

FIG. 12 shows a partial side view of magnetic sense element 22 and shield structure 24 integrated on substrate 28 in accordance with yet another embodiment. Like the configuration of FIG. 10, magnetic sense element 22 is embedded within passivation/protective material layer 182 on surface 26 of substrate 28. Likewise, at least a portion of first and second portions 42, 44 of shield structure 24 are embedded within and located below outer surface 184 of protective layer 182. Further, like the configuration of FIG. 11, each of first and second portions 42, 44 of shield structure 24 has the tapered profile such that first sidewall 186 closest to magnetic sense element 22 has first thickness 188 and second sidewall 190 farthest from magnetic sense element 22 has second thickness 192 that is greater than first thickness 188. Accordingly, first sidewall 186 is spaced apart from surface 26 of substrate 28 by first distance 194 and second sidewall 188 is spaced apart from surface 26 of substrate by second distance 196, with second distance 196 being less than first distance 194.

The configurations presented in FIGS. 9 and 11 generally involve the deposition of the material forming shield structure 24 on top of a wafer in which multiple magnetic sense elements 22 are formed. Conversely, the configurations presented in FIGS. 10 and 12 generally involve forming spaces in protective material layer 182 (i.e., lowering the surface of protective material layer 182) and depositing the material forming shield structure 24 into these spaces to produce shield structure 24 that is at least partially embedded with protective material layer 182. Thus, manufacture of the configurations presented in FIGS. 10 and 12 may be more complex than the configurations presented in FIGS. 9 and 11. The tapered profile presented in FIGS. 11 and 12, may enable the condensation of magnetic field line in Z-axis 56, thus increasing the gain of measurement magnetic field 30 in sense axis 34 and potentially improving signal quality.

Although FIGS. 9-12 are discussed in connection with shield structure 24, it should be readily apparent that the integrated configurations of shield structure 24 apply equivalently to any of the previously discussed shield structures. Further, alternative embodiments may include additional passivation coatings filling the space between first and second portions 42, 44 of shield structure 24 and fully encapsulating magnetic sense element 22 and shield structure 24.

Figure 13:
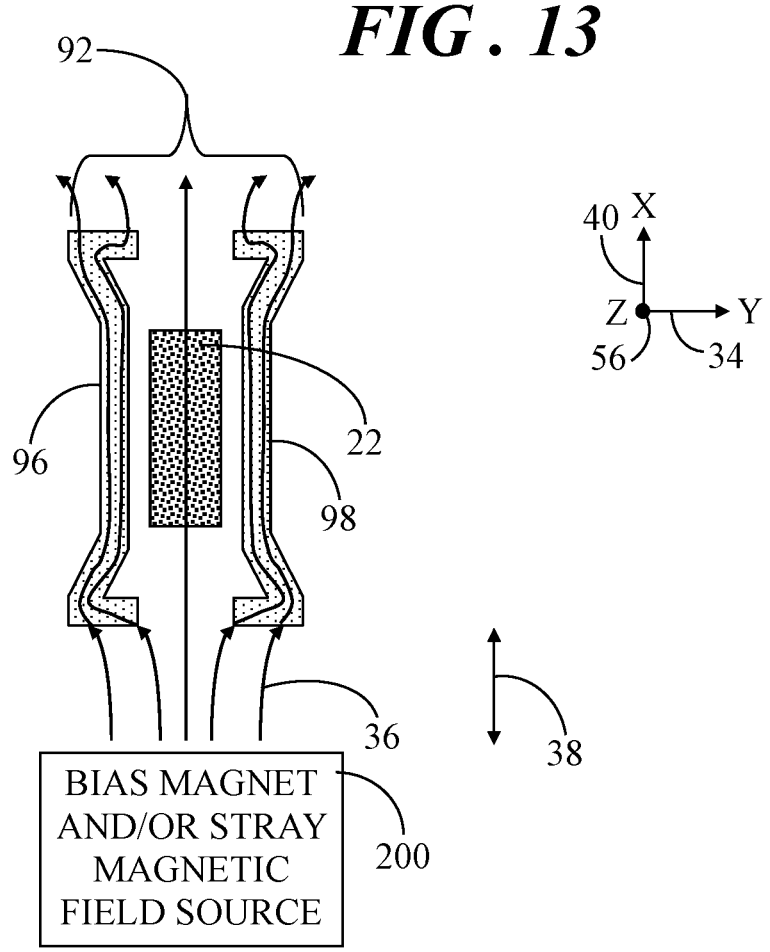
FIG. 13 shows a simplified top view of a magnetic sense element and a shield structure demonstrating the suppression of a stray magnetic field along a non-sensing axis.

FIG. 13 shows a simplified top view of magnetic sense element 22 and shield structure 92 demonstrating the suppression of stray magnetic field 36 along non-sensing axis 40, e.g., the X-axis. Although shield structure 92 is shown in connection with FIG. 13, the following discussion applies equivalently to any of the previously discussed shield structures or variations thereof.

In this example, stray magnetic field 36 along non-sensing axis 40 is generated by a bias magnet and/or a stray magnetic field source, in which the reference numeral 200 represents either of bias magnet and/or a stray magnetic field source. Due to the shape of shield structure 92, stray magnetic field 36 will be suppressed. That is, the shape of shield structure 92 leads to redirection of stray magnetic field 36 and reduces the magnetic field between first and second shield portions 96, 98 of shield structure 92. Thus, the magnetic field effect along non-sensing axis 40 imposed on magnetic sense element 22 is reduced. Bias magnet and/or a stray magnetic field source 200 represents the source of stray magnetic field 36, in this example, which may be generated along second direction 38. Accordingly, this example demonstrates that magnetic fields along second direction 38 (either stray magnetic field 36 and/or bias magnetic fields) will be weakened inside of shield structure 92, as well as the other previously described shield structures 24, 132, 160. Further discussion of bias magnet 200 will be provided in connection with FIG. 15.

Figure 14:
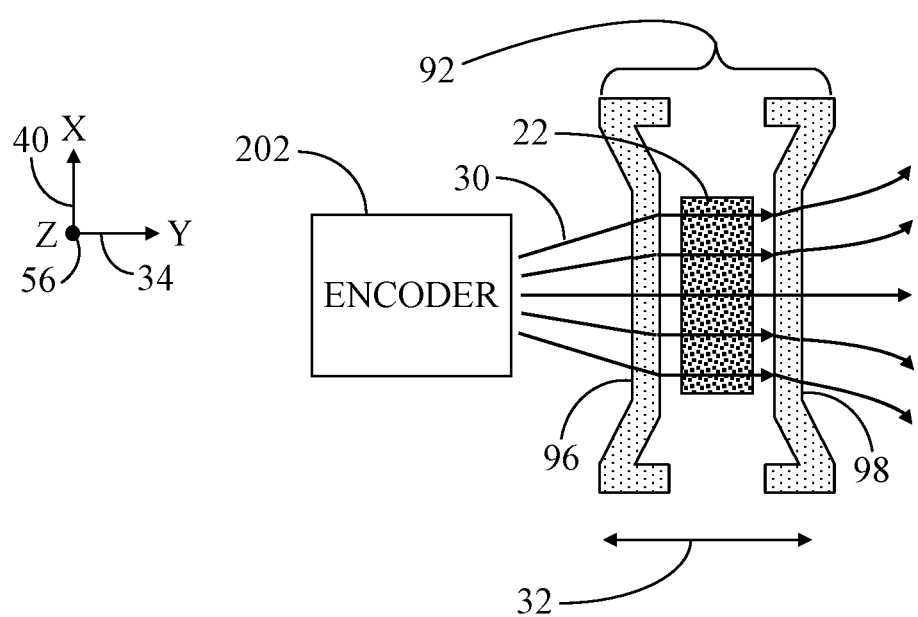
FIG. 14 shows a simplified top view of a magnetic sense element and a shield structure demonstrating sensing of a measurement magnetic field along a sense axis.

FIG. 14 shows a simplified top view of magnetic sense element 22 and shield structure 92 demonstrating sensing of a measurement magnetic field 30 along a sense axis 34, e.g., the Y-axis. Again, although shield structure 92 is shown in connection with FIG. 14, the following discussion applies equivalently to any of the previously discussed shield structures or variations thereof.

In this example, an encoder 202 generates measurement magnetic field 30 which can be detected by magnetic sense element 22. In an embodiment, encoder 202 may represent encoder wheel 54 (FIG. 2) which generates measurement magnetic field 30 as the alternating magnetic north and south poles of encoder wheel 54 as they pass by during rotation of encoder wheel 54. Due to the shape of shield structure 92, measurement magnetic field 30 will be smoothed (i.e., undergo parallelization) over the space between first and second shield portions 96, 98 of shield structure 92 with minor gain increase (e.g., approximately ten percent). In another embodiment, encoder 202 may represent a disc magnet (see FIG. 16, disc magnet 240) which generates the alternating magnetic field as the north and south poles of the disc magnet pass by magnetic sense elements (e.g., FIG. 16, 22A, 22A', 22B, 22B') during the rotation of the disc magnet.

Regarding FIGS. 13-14, FIG. 13 shows the magnetic flux lines (e.g., stray magnetic field 36 or bias magnetic field) emanating from bias magnet 200 or a stray magnetic field source (without an encoder) and the suppression achieved via shield structure 92, and FIG. 14 shows the magnetic flux lines (i.e., measurement magnetic field 30) emanating from encoder 202 (without a bias magnet) and the smoothing achieved via shield structure 92. Further, the positions and physical configurations of bias magnet and/or a stray magnetic field source 200 and encoder 202 shown in FIGS. 13-14 are merely representative. Instead, what is significant herein is that stray magnetic fields and/or bias magnetic fields 36 are generated along non-sensing axis 40 by bias magnet and/or a stray magnetic field source 200 and measurement magnetic fields 30 are generated along sensing axis 34 by encoder 202. In actual use, both bias magnet 200 and encoder 202 may be present in a system, such as system 52 (FIG. 2) showing only an encoder.

Figure 15:
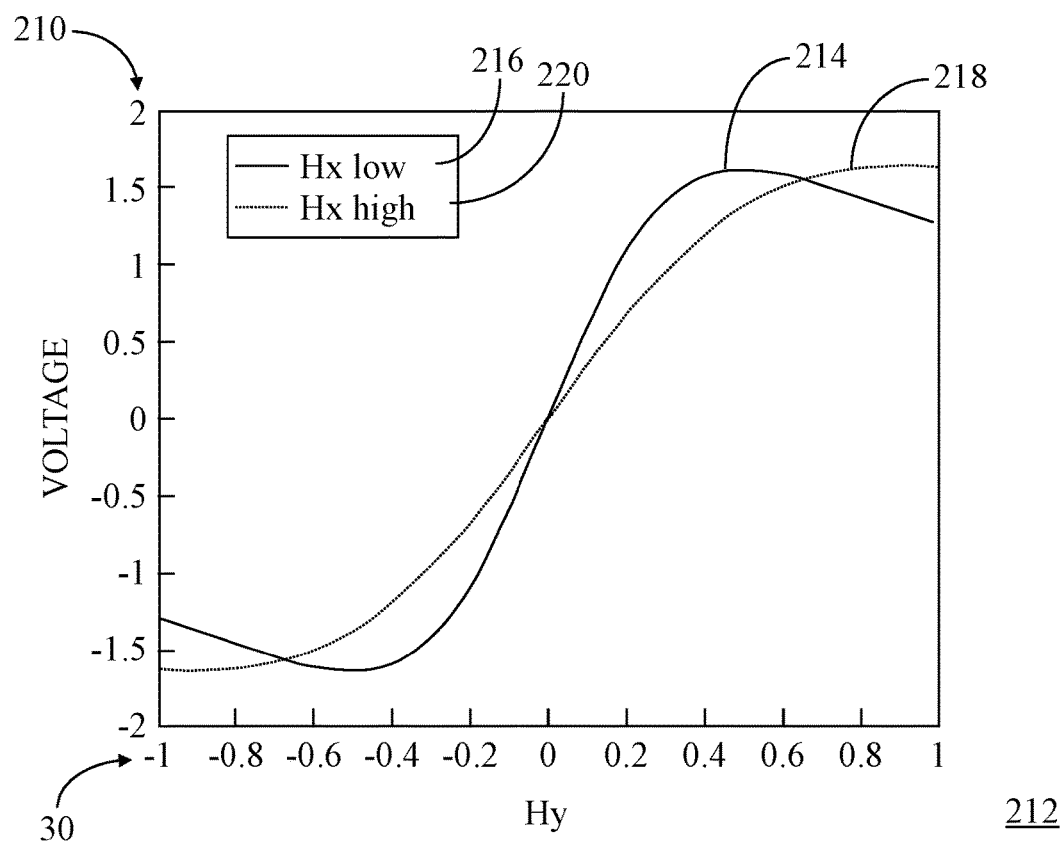
FIG. 15 shows a graph demonstrating changes in a sensed magnetic field due to different magnetic non-sensing axis fields.

FIG. 15 shows a graph 212 demonstrating changes in a sensed magnetic field due to different magnetic bias and/or magnetic stray fields 36. The presented example is for a linearized AMR sensor element (45° half bridge elements or barber pole structures). For a TMR or GMR sensor element, the curve may look different. However, the behavior is transferable. Bias magnet 200 may be implemented to adjust sensitivity and linear range in a magnetic sensor system. In this example, a first curve 214 represents a particular bias magnet and/or magnetic stray field source 200 generating a first magnetic field, Hx, 216 as response voltage 210 versus measurement magnetic field 30. A second curve 218 represents a particular bias magnet and/or magnetic stray field source 200 generating a second magnetic field, Hx, 220 as response voltage 210 versus measurement magnetic field 30. First curve 214 has higher sensitivity (i.e., is steeper) and a smaller linear range as compared to second curve 218. Thus, FIG. 15 demonstrates that inclusion of bias magnet 200 in a magnetic sensor system may yield higher robustness against stray magnetic fields and enable adjustable and/or increased linear range. On the other hand, FIG. 15 demonstrates the influence of a stray magnetic field from a magnet stray field source 200 on the sensor characteristic curve, thus influencing the sensor response.

Figure 16:
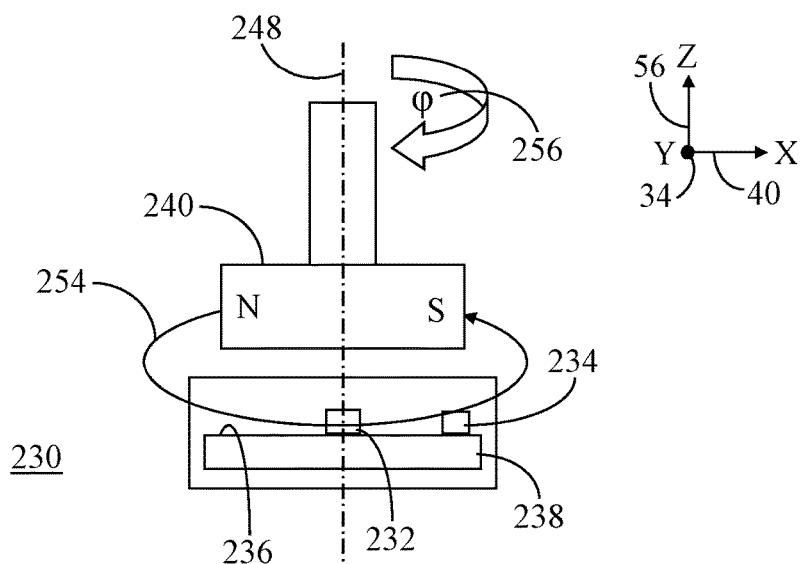
FIG. 16 shows a simplified partial side view a system for rotation angle sensing.
Figure 17:
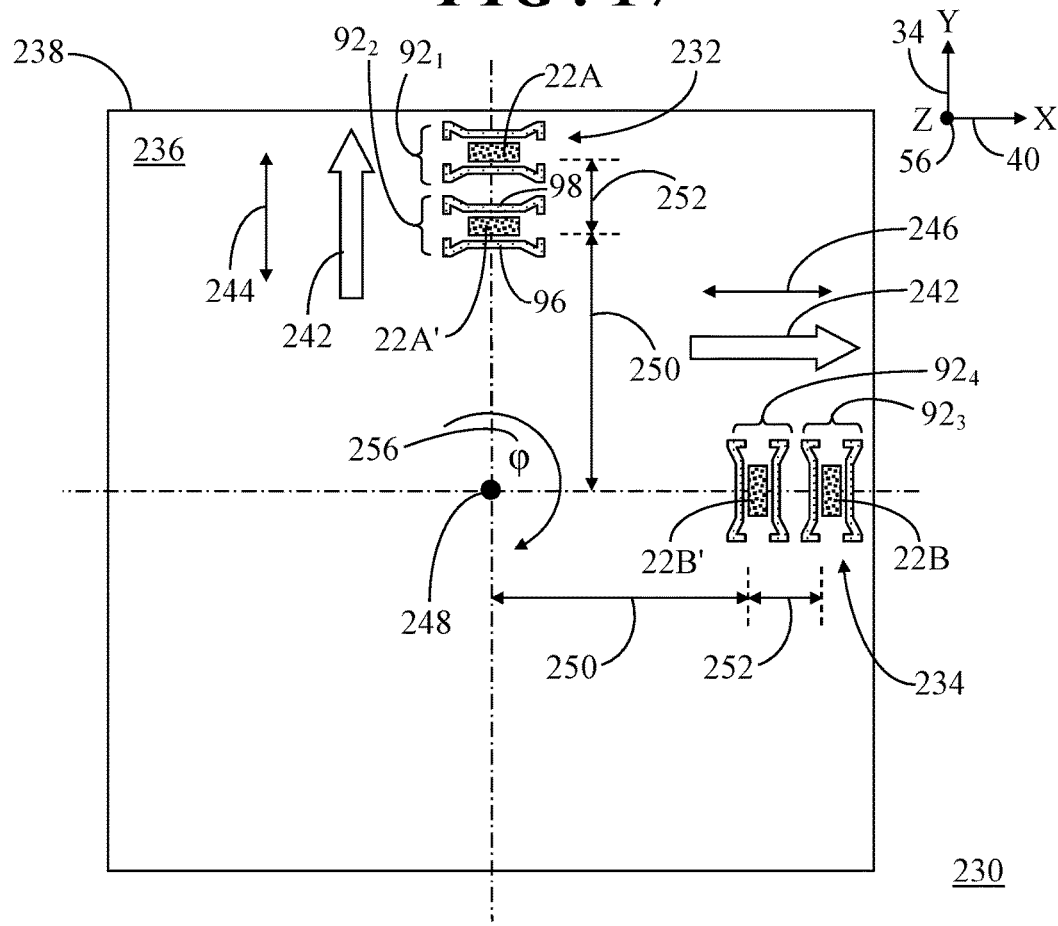
FIG. 17 shows a simplified top view of the system of FIG. 16.

Referring now to FIGS. 16-17, FIG. 16 shows a simplified partial side view a system 230 for rotation angle sensing and FIG. 17 shows a simplified top view of system 230. In an example described above, magnetic sense elements 22 (e.g., TMR, AMR, GMR, and the like) with integrated shield structures may be incorporated in system 52 (FIG. 2) for rotational speed measurement. In the embodiment of FIGS. 16-17, magnetic sense elements 22 with integrated shield structures may be suitably configured to sense angular position of an object. Shield structures 92 are shown system 230. However, the following discussion applies equivalently to any of the previously discussed shield structures or variations thereof.

System 230 generally includes first and second gradient units 232, 234 formed on a surface 236 of a substrate 238 and a magnet 240 vertically displaced away from first and second gradient units 232, 234 along Z-axis 56. Magnet 240 is not shown in the top view illustrated in FIG. 17 in order to better visualize the features formed on surface 236 of substrate 238. First gradient unit 232 includes a first one of magnetic sense elements, labeled 22A, disposed between first and second shield portions 96, 98 of a first shield structure, labeled $92_1$, and a second one of the magnetic sense elements, labeled 22A' disposed between first and second shield portions 96, 98 of a second shield structure 92, labeled $92_2$. Likewise, second gradient unit 234 includes a third one of magnetic sense elements, labeled 22B, disposed between first and second shield portions 96, 98 of a third shield structure 92, labeled $92_3$, and a fourth one of the magnetic sense elements, labeled 22B' disposed between first and second shield portions 96, 98 of a fourth shield structure 92, labeled $92_4$.

In accordance with an embodiment, second gradient unit 234 is rotated ninety degrees relative to first gradient unit 232. That is, a longitudinal dimension of first and second magnetic sense elements, 22A, 22A' and first and second shield portions 92, 96 of first and second shield structures $92_1$, $92_2$ is aligned with X-axis 40. Additionally, a longitudinal dimension of third and fourth magnetic sense elements, 22B, 22B' and first and second shield portions 92, 96 of third and fourth shield structures $92_3$, $92_4$ is aligned with Y-axis 34. Thus, magnetic sense elements 22A, 22A' are configured to sense a measurement magnetic field 242 along a first sense axis, i.e., Y-axis 34, oriented in a first direction 244 approximately parallel to surface 236 of substrate 238. Magnetic sense elements 22B, 22B' are configured to sense measurement magnetic field 242 along a second sense axis, i.e., X-axis 40, oriented in a second direction 246 approximately parallel to surface 236 of substrate 238.

Second gradient unit 234 is spaced apart from first gradient unit 232 by ninety degrees relative to an axis of rotation 248 perpendicular surface 236 of substrate 238. Additionally, first and second gradient units 232, 234 are located the same radial distance 250 away from axis of rotation 248. Further, first magnetic sense element 22A is laterally spaced apart from second magnetic sense element 22A' by a distance 252 and third magnetic sense element 22B is laterally spaced apart from fourth magnetic sense element 22B' by the same distance 252. In another embodiment, the distance between magnetic sense elements 22A, 22A', 22B, and 22B' may differ.

Magnet 240 may be a permanent magnet in the form of, for example, a disc, ring, rectangle, or bar shape. Magnet 240 is configured to rotate about axis of rotation 248 relative to first and second gradient units 232, 234. Magnet 240 produces a magnetic field 254 substantially parallel to surface 236 of substrate 238. Magnetic field 254 rotates along with magnet 240 relative to first and second gradient units 232, 234. This magnetic field 254 is detectable by first and second gradient units 232, 234, and thus may be referred to herein as a gradient magnetic field 254. As will be discussed below, gradient magnetic field 254 detected by first and second gradient units 232, 234, may be suitably processed to identify a rotation angle, 256, labeled φ, of magnet 240 relative to first and second gradient units 232, 234. Although only two gradient units (e.g., first and second gradient units 232, 234) are shown, alternative embodiments may include a multitude of gradient units. In such a configuration, the signals of the opposing gradient unit can be average. Thus, possible errors from eccentricity and so forth may be mitigated.

Figure 18:
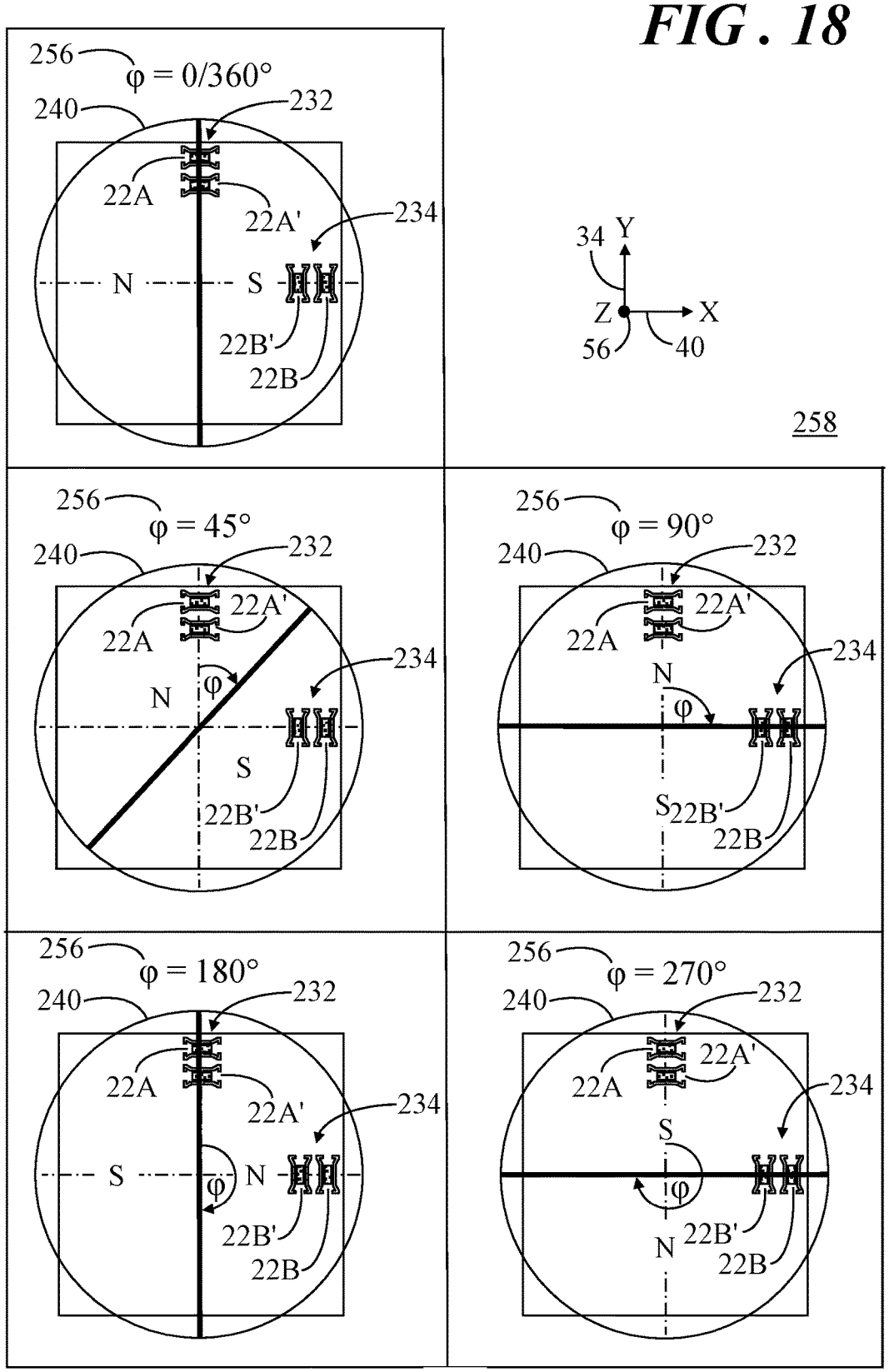
FIG. 18 shows a table of possible positions of a rotating magnet relative to magnetic sense elements of the system of FIG. 16.
Figure 20:
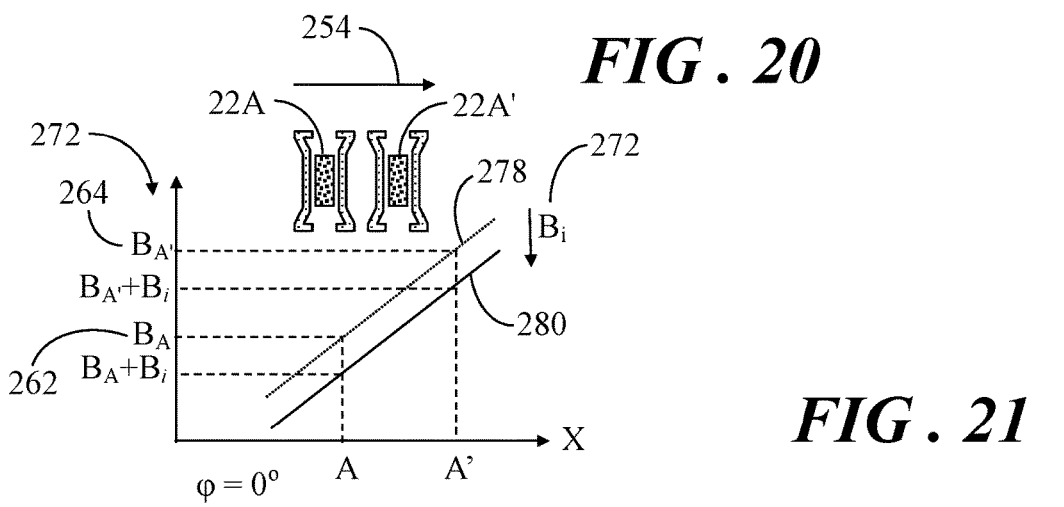
FIG. 20 shows a graph of a magnetic field gradient along the direction of the sensing axes for a first gradient unit of the system of FIG. 16.

FIG. 18 shows a table 258 of possible rotation angles 256, φ, of magnet 240 rotating relative to magnetic sense elements 22A, 22A', 22B, 22B' of first and second gradient units 232, 234 of system 230 (FIG. 16). In this example, magnet 240 is a diametrically magnetized magnet that is magnetized across its diameter, having the north and south poles located at opposing sides of magnet 240 relative to its diameter. The rotation angles 256 shown in table 258 include φ equal to 0 or 360°, φ=45°, φ=90°, φ=180°, and φ=270°. Rotation angles 256 shown in FIG. 20 are provided as examples only. It should be understood that can be many more possible rotation angles 256 ranging between 0 and 360°.

Figure 19:
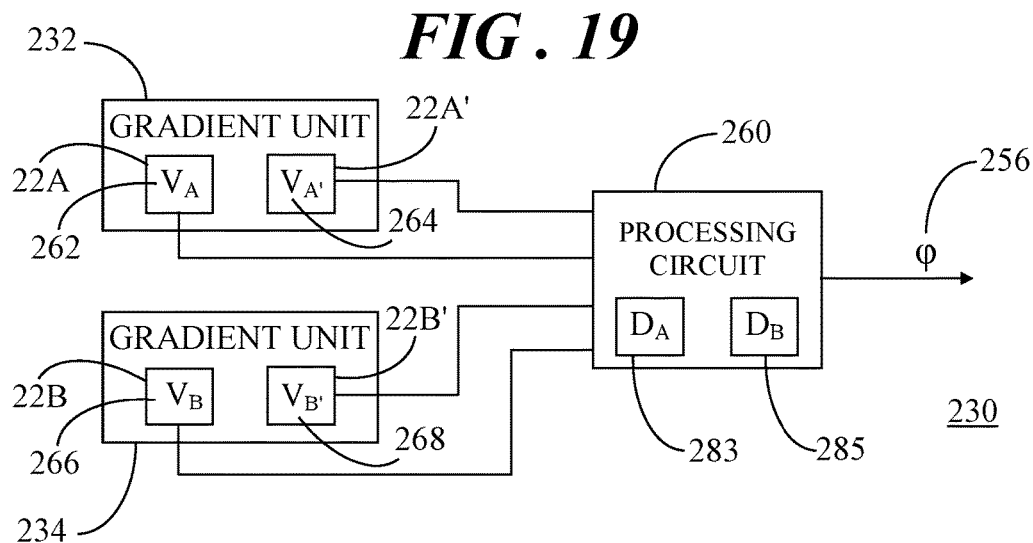
FIG. 19 shows a block diagram of the system of FIG. 16.

FIG. 19 shows a block diagram of system 230. First gradient unit 232 including first and second magnetic sense elements 22A, 22A' disposed between shield structures (not shown, described above) have inputs coupled to a processing circuit 260. Likewise, second gradient unit 234 including third and fourth magnetic sense elements 22B, 22B' disposed between shield structures (not shown, described above) have inputs coupled to processing circuit 260. First magnetic sense element 22A is configured to produce a first output signal 262, $V_A$, in response to magnetic field 254 (FIG. 16). Second magnetic sense element 22A' is configured to produce a second output signal 264, $V_{A'}$, in response to magnetic field 254. Third magnetic sense element 22B is configured to produce a third output signal 266, $V_B$, in response to magnetic field 254. And fourth magnetic sense element 22B' is configured to produce a fourth output signal 268, $V_{B'}$, in response to magnetic field 254.

Figure 21:
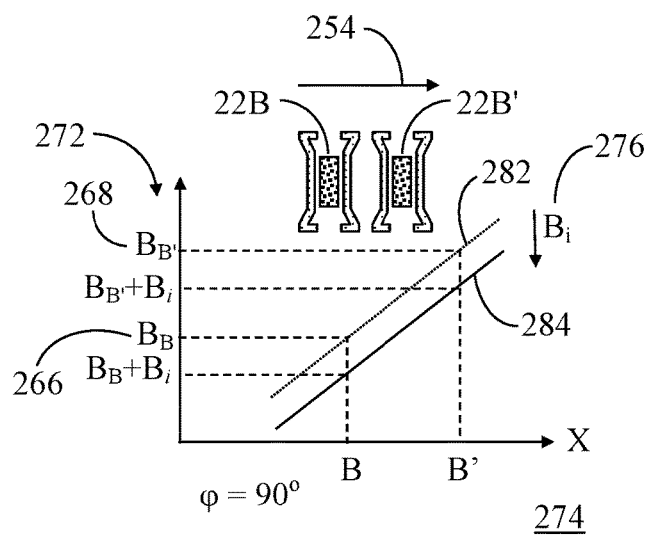
FIG. 21 shows a graph of a magnetic field gradient along the direction of the sensing axes for a second gradient unit of the system of FIG. 16.

Referring to FIGS. 20-21 in connection with the block diagram of FIG. 19, FIG. 20 shows a graph 270 of a typical example of a magnetic field gradient produced by magnet 240 along direction 40. This example is provided for the case in which rotation angle 256, φ, is equal to 0°, as presented above in connection with FIG. 18. The magnetic field gradient is shown with and without the presence of a magnetic interference field component 272, $B_i$. Likewise, FIG. 21 shows a graph 274 of a typical example of a magnetic field gradient produced by magnet 240 along direction 34. This example is provided for the case in which rotation angle 256, φ, is equal to 90°, as presented above in connection with FIG. 18. The magnetic field gradient is shown with and without the presence of a magnetic interference field component 276, $B_i$.

Multiplication of magnetic field 254 with the sensor sensitivity, S (discussed below), results in first and second output signals 262, 264 (FIG. 20) and third and fourth output signals 262, 268 (FIG. 21). As a consequence, FIGS. 20-21 can be associated with the block diagram of FIG. 19. FIG. 20 thus shows graph 270 of first and second output signals 262, 264 for first gradient unit 232 and an effect that magnetic interference field component 272, $B_i$, may have on first and second output signals 262, 264. Likewise, FIG. 21 thus shows graph 274 of third and fourth output signals 266, 268 for second gradient unit 234 and an effect that magnetic interference field component 276, $B_i$, may have on third and fourth output signals 266, 268.

In FIG. 20, a dotted line 278 represents a linear gradient range and related magnetic fields (i.e., first and second output signals 262, 264) at the relative positions defined by radial distance 250 (FIG. 17) from axis of rotation 248 (FIG. 17) and distance 252 (FIG. 17) between first and second magnetic sense elements 22A, 22A'. A solid line 280 represents a linear gradient range and related magnetic fields (i.e., first and second output signals 262, 264) with an additional spatial homogenous interference magnetic field component 272, $B_i$. Likewise, in FIG. 21, a dotted line 282 represents a linear gradient range and related magnetic fields (i.e., third and fourth output signals 266, 268) at the relative positions defined by radial distance 250 from axis of rotation 248 and distance 252 between third and fourth magnetic sense elements 22B, 22B'. A solid line 284 represents a linear gradient range and related magnetic fields (i.e., third and fourth output signals 266, 268) with an additional spatial homogenous magnetic interference field component 276, $B_i$.

Processing circuit 260 may be an application specific integrated circuit (ASIC) that includes a combination of hardware and software for suitably processing first, second, third, and fourth output signals 262, 264, 266, 268 to identify angular position 256. Processing circuit 260 is electrically coupled with first gradient unit 232 and is configured to produce a first differential output signal 283 as a difference between first and second output signals 262, 264, the difference between first and second output signals 262, 264 cancelling magnetic interference field component 272. Additionally, processing circuit 260 is electrically coupled with second gradient unit 234 and is configured to produce a second differential output signal 285 as a difference between third and fourth output signals 266, 268, the difference between the third and fourth output signals 266, 268 cancelling magnetic interference field component 276. The magnetic shield (e.g., shield structure 92 in this example) suppresses stray axis field effects from directions 40 and 34, respectively, thus eliminating the effect on the sensitivity of the magnetic sense elements 22A, 22A', 22B, 22B'. Rotation angle 256 (FIG. 17) of magnet 240 (FIG. 16) relative to first and second gradient units 232, 234 can thereafter be identified by division of the first and second differential output signals.

An output voltage $V_A$ and $V_{A'}$ of first and second magnetic sense elements 22A and 22A' of first gradient unit 232 can be described as follows:

$$V_A = S \times B_A \qquad (1)$$

$$V_{A'} = S \times B_{A'} \qquad (2)$$

S is the sensitivity of the magnetic sense elements and is assumed to be equal for both of first and second magnetic sense elements 22A, 22A' (e.g., achieved by fabrication accuracy or trimming). The spatial homogenous magnetic interference field component 272, $B_i$, leads to the same voltage shift in both of first and second magnetic sense elements 22A, 22A' as follows:

$$V_A = S \times B_A + S \times B_i \qquad (3)$$

$$V_{A'} = S \times B_{A'} + S \times B_i \qquad (4)$$

Calculation of differential output signal 283, $D_A$ (FIG. 21) entails taking the difference of the two voltage signals and thereby cancelling magnetic interference field component 274, as follows:

$$D_A = V_{A'} - V_A = (S \times B_{A'} + SB_i) - (S \times B_A + SB_i) = S(B_{A'} - B_A) \qquad (5)$$

Similarly, output voltage $V_B$ and $V_{B'}$ of third and fourth magnetic sense elements 22B and 22B' of second gradient unit 234 can be described as follows:

$$V_B = S \times B_B \qquad (6)$$

$$V_{B'} = S \times B_{B'} \qquad (7)$$

Again, S is the sensitivity of the magnetic sense elements and is assumed to be equal for both of third and fourth magnetic sense elements 22B, 22B' (e.g., achieved by fabrication accuracy or trimming). The spatial homogenous magnetic interference field component 276, $B_i$, leads to the same voltage shift in both of third and fourth magnetic sense elements 22B, 22B' as follows:

$$V_B = S \times B_B + S \times B_i \quad (8)$$

$$V_{B'} = S \times B_{B'} S \times B_i \quad (9)$$

Calculation of differential output signal 285, $D_A$ (FIG. 21) entails taking the difference of the two voltage signals and thereby cancelling magnetic interference field component 276, as follows:

$$D_B = V_{B'} - V_B = (S \times B_{B'} + SB_i) - (S \times B_B + SB_i) = S(B_{B'} - B_B) \quad (10)$$

Figure 22:
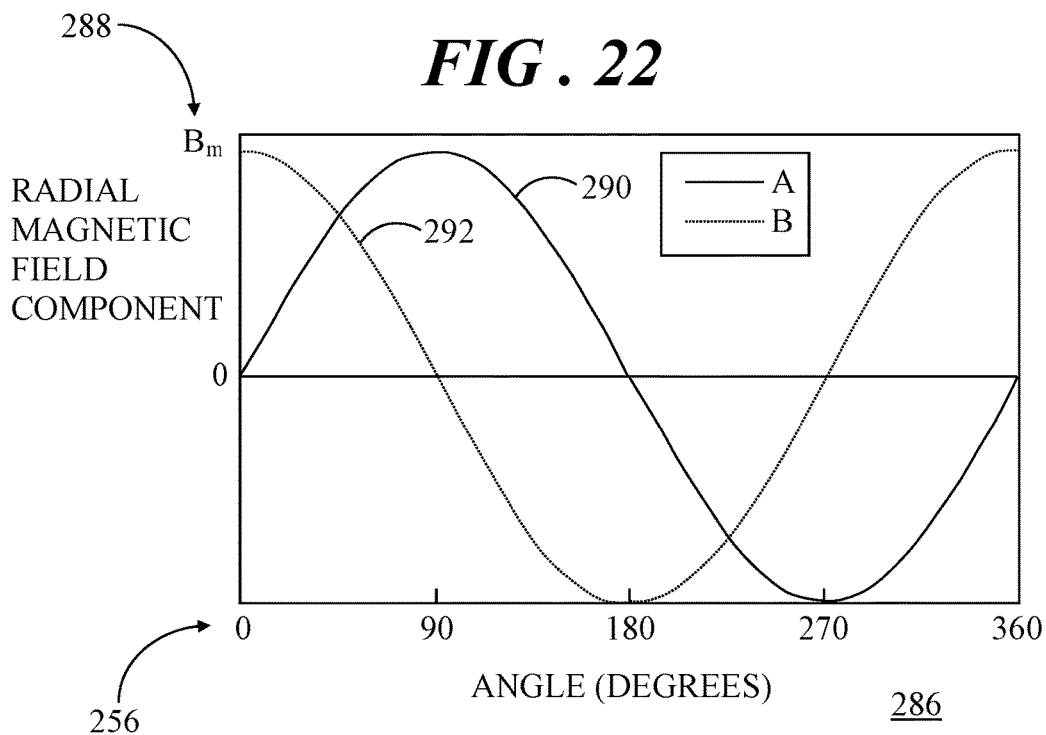
FIG. 22 shows a graph of a change of radial magnetic field components at the first and second gradient units of FIG. 16 as functions of a rotation angle.

FIG. 22 shows a graph 286 of a change of radial magnetic field components 288 at the positions of first and second gradient units 232, 234 (FIG. 16) as functions of rotation angle 256. A solid curve 290 represents a change of magnetic field component 288 at first gradient unit 232 and a dotted curve 292 represents a change of magnetic field component 288 at second gradient unit 234 as a functions of rotation angle 256. With regard to graph 286, magnetic field 254 (FIG. 16) at the position of first and second magnetic sense elements 22A, 22A' of first gradient unit 232 can be described as:

$$B_A = B_m \sin \varphi \quad (11)$$

$$B_{A'} = B_{m'} \sin \varphi \quad (12)$$

In equation (11), $B_m$ represents the radial amplitude of magnetic field 254. Due to the ninety degree rotated arrangement of first and second gradient units, the mathematical relationship of third and fourth magnetic sense elements 22B, 22B' of second gradient unit 234 can be described as:

$$B_B = B_m \cos \varphi \quad (13)$$

$$B_{B'} = B_{m'} \cos \varphi \quad (14)$$

The magnetic field gradient for first gradient unit 232 can therefore be described as:

$$B_{A'} - B_A = B_{m'} \sin \varphi - B_m \sin \varphi = (B_{m'} - B_m) \times \sin \varphi = B_{mGA} \times \sin \varphi \quad (15)$$

The operator $B_{mGA}$ is equal to $(B_{m'} - B_m)$. Similarly, the magnetic field gradient for second gradient unit 234 can be described as:

$$B_{B'} - B_B = B_{m'} \cos \varphi - B_m \cos \varphi = (B_{m'} - B_m) \times \cos \varphi = B_{mGA} \times \cos \varphi \quad (16)$$

By substituting equation (15) into equation (5), the differential output voltage 283, $D_A$, can be determined as follows:

$$D_A = S \times B_{mGA} \times \sin \varphi \quad (17)$$

By substituting equation (16) into equation (10), the differential output voltage 285, $D_B$, can be determined as follows:

$$D_B = S \times B_{mGA} \times \cos \varphi \quad (18)$$

Thus, angular position 256, $\varphi$, can be calculated by division of the differential output voltages, $D_A$ and $D_B$, as follows:

$$\frac{D_A}{D_B} = \frac{S \times B_{mGA} \times \sin \varphi}{S \times B_{mGA} \times \cos \varphi} = \tan \varphi \quad (19)$$

Thus, angular position 256 of magnet 240 (FIG. 16) can be identified utilizing the differential output voltages, $D_A$ and $D_B$, as follows:

$$\varphi = \arctan \frac{D_A}{D_B} \quad (20)$$

Figure 23:
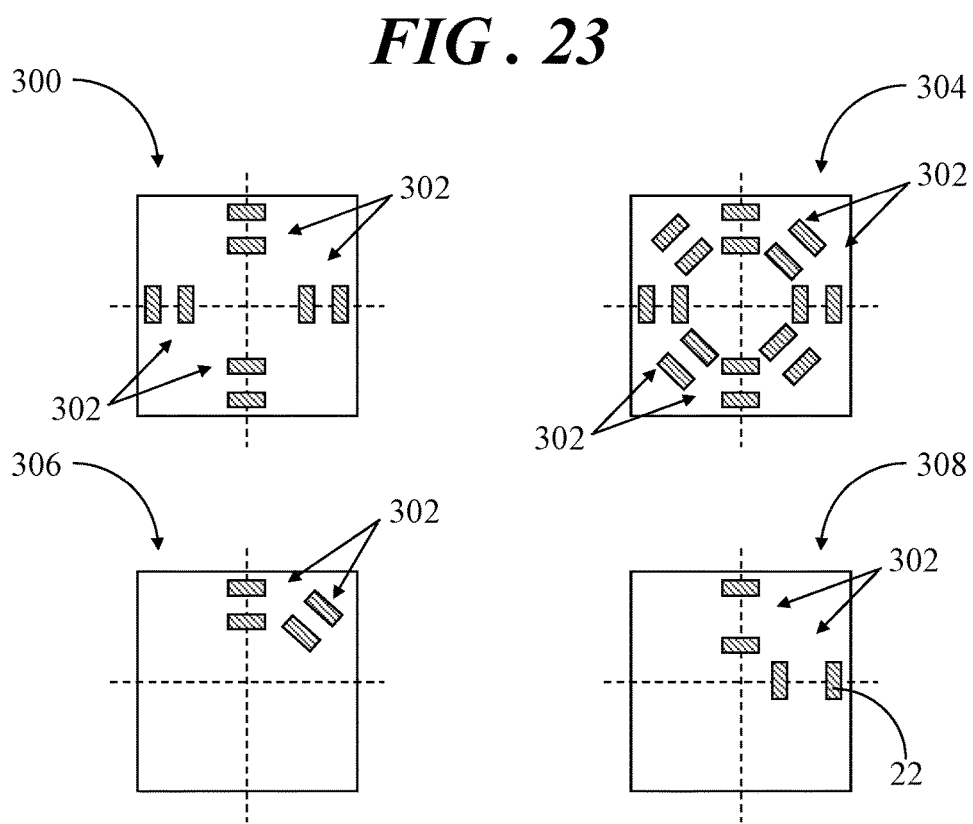
FIG. 23 shows various simplified top views showing positions of gradient units that may alternatively be incorporated into the system of FIG. 16.

FIG. 23 shows various simplified top views showing positions of gradient units that may alternatively be incorporated into the system of FIG. 16. As mentioned previously, alternative embodiments of system 230 (FIG. 16) may include a multitude of gradient units. Further, these gradient units may be arranged differently. Accordingly, FIG. 23 includes a first configuration 300 having four gradient units 302 each separated by 90°. Additionally, second configuration 304 is shown having eight gradient units 302, each separated by 45°. A third configuration 306 is shown having two gradient units 302, separated by 45°. And a fourth configuration 308 is shown having two gradient units, in which the magnetic sense elements 22 are separated by a greater distance than that shown previously. FIG. 23 only shows a few configurations of gradient units. Other configurations may be equivalently applicable.

Embodiments described herein entail magnetic field sensors and magnetic field sensor systems with integrated magnetic field shield structures for measuring magnetic fields while suppressing stray magnetic fields. An embodiment of a magnetic field sensor comprises a magnetic sense element formed on a substrate, the magnetic sense element being configured to sense a measurement magnetic field along a sense axis oriented in a first direction approximately parallel to a surface of the substrate. A shield structure is formed on the substrate. The shield structure has first and second shield portions and the magnetic sense element is disposed between the first and second shield portions. Each of the first and second shield portions includes a body and first and second brim segments extending from opposing ends of the body. The body is aligned substantially parallel to a second direction that is perpendicular to the first direction and approximately parallel to the surface of the substrate, and the first and second brim segments are aligned substantially parallel to the first direction, the first and second shield portions being arranged in mirror symmetry with the first and second brim segments of each of the first and second shield portions extending toward one another.

An embodiment of system comprises a magnetic sense element formed on a substrate, the magnetic sense element being configured to sense a measurement magnetic field along a sense axis oriented in a first direction approximately parallel to a surface of the substrate. A shield structure is formed on the substrate. The shield structure has first and second shield portions and the magnetic sense element is disposed between the first and second shield portions. Each of the first and second shield portions includes a body and first and second brim segments extending from opposing ends of the body, the body being aligned substantially parallel to a second direction that is perpendicular to the first direction and approximately parallel to the surface of the substrate, and the first and second brim segments being aligned substantially parallel to the first direction, the first and second shield portions being arranged in mirror symmetry with the first and second brim segments of each of the first and second shield portions extending toward one another. The system further includes a bias magnet proximate the magnetic sense element, the bias magnet being configured to produce a bias magnetic field oriented in the second direction, and an encoder configured to produce the measurement magnetic field.

Another embodiment of a system comprises a first gradient unit formed on a surface of a substrate. The first gradient unit comprises a first magnetic sense element disposed between first and second shield portions of a first shield structure, and a second magnetic sense element disposed between the first and second shield portions of a second shield structure, the first and second magnetic sense elements being configured to sense a measurement magnetic field along a first sense axis oriented in a first direction approximately parallel to a surface of the substrate. The system further comprises a second gradient unit formed on the substrate, the second gradient unit being rotated ninety degrees relative to the first gradient unit and spaced apart from the first gradient unit by ninety degrees relative to an axis of rotation perpendicular to the surface of the substrate, the first and second gradient units being located the same radial distance away from the axis of rotation. The second gradient unit comprises a third magnetic sense element disposed between the first and second shield portions of a third shield structure, and a fourth magnetic sense element disposed between the first and second shield portions of a fourth shield structure, the third and fourth magnetic sense elements being configured to sense the measurement magnetic field along a second sense axis oriented in a second direction that is perpendicular to the first direction and approximately parallel to a surface of the substrate. A magnet is configured to rotate about the axis of rotation relative to the first and second gradient units, the magnet producing a the measurement magnetic field as a gradient magnetic field substantially parallel to the surface of the substrate that is detectable by the first and second gradient units.

The particular geometric configurations of the shield structure can be varied to provide shielding or suppression of stray magnetic field along a non-sensing axis of the magnetic sense elements with minor or little gain of the measurement magnetic field along a sensing axis of the magnetic sense elements. Further, the geometric parameters of the shield structures can be varied to independently adjust gain along the sensing axis and suppression along the non-sensing axis. The magnetic field shield structures may be vertically integrated with the magnetic sense elements to achieve reductions in size and cost savings. Further, the magnetic field sense elements with the shield structures can be implemented in various system configurations for purposes of speed and direction sensing, rotation angle sensing, proximity sensing, and the like.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A magnetic field sensor comprising:
   a magnetic sense element formed on a substrate, said magnetic sense element being configured to sense a measurement magnetic field along a sense axis oriented in a first direction approximately parallel to a surface of said substrate; and
   a shield structure formed on said substrate, said shield structure having first and second shield portions, said magnetic sense element being disposed between said first and second shield portions, wherein each of said first and second shield portions includes a body and first and second brim segments extending from opposing ends of said body, said body being aligned substantially parallel to a second direction that is perpendicular to said first direction and approximately parallel to said surface of said substrate, and said first and second brim segments being aligned substantially parallel to said first direction, said first and second shield portions being arranged in mirror symmetry with said first and second brim segments of each of said first and second shield portions extending toward one another, wherein said body of said each of said first and second shield portions comprises:
   a first end section coupled to said first brim segment;
   a second end section coupled to said second brim segment, each of said first and second end sections having a first sidewall; and
   an intermediate section interposed between said first and second end sections, said intermediate section having a first section sidewall coupled to and contiguous with said first sidewall of said each of said first and second end sections, said first section sidewall being spaced apart from said magnetic sense element by a gap, wherein said first section sidewall of said intermediate section is laterally displaced in said first direction away from a centerline of said magnetic sense element by a first distance, and said first sidewall of said each of said first and second end sections laterally tapers away from said centerline of said magnetic sense element from said first distance at a junction of said first section sidewall and said first sidewall to a second distance at a junction of said first sidewall and a corresponding one of said first and second brim segments, said second distance being greater than said first distance.

2. The magnetic field sensor of claim 1 wherein said shield structure is configured to suppress a stray magnetic field along a non-sensing axis in said second direction, and wherein said first and second brim segments are a sufficient length to suppress said stray magnetic field along said non-sensing axis in said second direction.

3. The magnetic field sensor of claim 1 wherein said intermediate section comprises a second section sidewall separated from said first section sidewall by a width of said intermediate section in said first direction, and said each of said first and second end sections of said body has a second sidewall coupled to and contiguous with said second section sidewall that laterally tapers away from said second section sidewall toward said first sidewall.

4. The magnetic field sensor of claim 1 wherein said intermediate section comprises a second section sidewall separated from said first section sidewall by a width of said intermediate section in said first direction, and said each of said first and second end sections of said body has a second sidewall coupled to and contiguous with said second section sidewall, said second sidewall being oriented substantially parallel to said first sidewall of said each of said first and second end sections of said body.

5. The magnetic field sensor of claim 4 wherein said width is a first width, and each of said first and second end sections exhibits a second width in said first direction that is substantially equivalent to said first width.

6. The magnetic field sensor of claim 1 wherein said intermediate section comprises a second section sidewall separated from said first section sidewall by a width of said intermediate section in said first direction, and said each of said first and second end sections of said body has a second sidewall coupled to and contiguous with said second section sidewall, said second sidewall being longitudinally aligned with said second section sidewall in said second direction.

7. The magnetic field sensor of claim 1 wherein:
said magnetic sense element has a first length oriented in said second direction; and
said intermediate section of said body has a second length oriented in said second direction that is no less than said first length of said magnetic sense element.

8. The magnetic field sensor of claim 1 wherein said magnetic sense element is embedded within a protective material layer on said surface of said substrate and said shield structure is formed on an outer surface of said protective material layer.

9. The magnetic field sensor of claim 1 wherein said magnetic sense element is embedded within a protective material layer on said surface of said substrate and at least a portion of said shield structure is embedded within said protective material layer.

10. The magnetic field sensor of claim 1 further comprising an encoder configured to produce said measurement magnetic field.

11. A magnetic field sensor comprising:
a magnetic sense element formed on a substrate, said magnetic sense element being configured to sense a measurement magnetic field along a sense axis oriented in a first direction approximately parallel to a surface of said substrate; and
a shield structure formed on said substrate, said shield structure having first and second shield portions, said magnetic sense element being disposed between said first and second shield portions, wherein each of said first and second shield portions includes a body and first and second brim segments extending from opposing ends of said body, said body being aligned substantially parallel to a second direction that is perpendicular to said first direction and approximately parallel to said surface of said substrate, and said first and second brim segments being aligned substantially parallel to said first direction, said first and shield portions being arranged in mirror symmetry with said first and second brim segments of each of said first and second shield portions extending toward one another, and wherein each of said first and second shield portions has a tapered profile such that a first sidewall of said each of said first and second shield portions closest said magnetic sense element has a first thickness and a second sidewall of said each of said first and second shield portions farthest from said magnetic sense element has a second thickness that is greater than said first thickness.

12. The magnetic field sensor of claim 11 wherein said first sidewall is spaced apart from said surface of said substrate by a first distance and said second sidewall is spaced apart from said surface of said substrate by a second distance, said second distance being less than said first distance.

13. A magnetic field sensor comprising:
a magnetic sense element formed on a substrate, said magnetic sense element being configured to sense a measurement magnetic field along a sense axis oriented in a first direction approximately parallel to a surface of said substrate;
a shield structure formed on said substrate, said shield structure having first and second shield portions, said magnetic sense element being disposed between said first and second shield portions, wherein each of said first and second shield portions includes a body and first and second brim segments extending from opposing ends of said body, said body being aligned substantially parallel to a second direction that is perpendicular to said first direction and approximately parallel to said surface of said substrate, and said first and second brim segments being aligned substantially parallel to said first direction, said first and shield portions being arranged in mirror symmetry with said first and second brim segments of each of said first and second shield portions extending toward one another; and
a bias magnet proximate said magnetic sense element, said bias magnet being configured to produce a bias magnetic field oriented in said second direction.

14. A system comprising:
a magnetic sense element formed on a substrate, said magnetic sense element being configured to sense a measurement magnetic field along a sense axis oriented in a first direction approximately parallel to a surface of said substrate;
a shield structure formed on said substrate, said shield structure having first and second shield portions, said magnetic sense element being disposed between said first and second shield portions, wherein each of said first and second shield portions includes a body and first and second brim segments extending from opposing ends of said body, said body being aligned substantially parallel to a second direction that is perpendicular to said first direction and approximately parallel to said surface of said substrate, and said first and second brim segments being aligned substantially parallel to said first direction, said first and second shield portions being arranged in mirror symmetry with said first and second brim segments of each of said first and second shield portions extending toward one another;
a bias magnet proximate said magnetic sense element, said bias magnet being configured to produce a bias magnetic field oriented in said second direction; and
an encoder configured to produce said measurement magnetic field.

15. A system comprising:
a first gradient unit formed on a surface of a substrate, said first gradient unit comprising:
a first magnetic sense element disposed between first and second shield portions of a first shield structure; and
a second magnetic sense element disposed between said first and second shield portions of a second shield structure, said first and second magnetic sense elements being configured to sense a measurement magnetic field along a first sense axis oriented in a first direction approximately parallel to a surface of said substrate;

a second gradient unit formed on said substrate, said second gradient unit being rotated ninety degrees relative to said first gradient unit and spaced apart from said first gradient unit by ninety degrees relative to an axis of rotation perpendicular to said surface of said substrate, said first and second gradient units being located the same radial distance away from said axis of rotation, said second gradient unit comprising:

a third magnetic sense element disposed between said first and second shield portions of a third shield structure; and a fourth magnetic sense element disposed between said first and second shield portions of a fourth shield structure, said third and fourth magnetic sense elements being configured to sense said measurement magnetic field along a second sense axis oriented in a second direction that is perpendicular to said first direction and approximately parallel to a surface of said substrate; and a magnet configured to rotate about said axis of rotation relative to said first and second gradient units, said magnet producing said measurement magnetic field as a gradient magnetic field substantially parallel to said surface of said substrate that is detectable by said first and second gradient units.

16. The system of claim 15 wherein:

said first magnetic sense element is laterally spaced apart from said second magnetic sense element by a distance; and said third sense element is laterally spaced apart from said fourth magnetic sense element by said distance.

17. The system of claim 15 wherein:

each of said first and second shield portions includes a body and first and second brim segments extending from opposing ends of said body;

for said first and second magnetic field elements, said body is aligned substantially parallel to said second direction and said first and second brim segments are aligned substantially parallel to said first direction; and for said third and fourth magnetic field elements, said body is aligned substantially parallel to said first direction and said first and second brim segments are aligned substantially parallel to said second direction.

18. The system of claim 15 wherein said magnet comprises a diametrically magnetized disc magnet.

19. The system of claim 15 wherein said first magnetic sense element is configured to produce a first output signal in response to said measurement magnetic field, said second magnetic sense element is configured to produce a second output signal in response to said measurement magnetic field, said third magnetic sense element is configured to produce a third output signal in response to said measurement magnetic field, said fourth magnetic sense element is configured to produce a fourth output signal in response to said measurement magnetic field, and said system further comprises a processing circuit electrically coupled with said first and second gradient units, wherein said processing circuit is configured to:

produce a first differential output signal as a difference between said first and second output signals, said difference between said first and second output signals canceling a first magnetic interference field;

produce a second differential output signal as a difference between said third and fourth output signals, said difference between said third and fourth output signals canceling a second magnetic interference field; and identify an angular position of said permanent disc magnet relative to said first and second gradient units utilizing said first and second differential output signals.

* * * * *